(12) United States Patent
Tahan et al.

(10) Patent No.: US 9,397,293 B2
(45) Date of Patent: Jul. 19, 2016

(54) PHONITON SYSTEMS, DEVICES, AND METHODS

(71) Applicants: Charles George Tahan, McLean, VA (US); Rousko Todorov Hristov, College Park, MD (US); Oney O. Soykal, Silver Spring, MD (US)

(72) Inventors: Charles George Tahan, McLean, VA (US); Rousko Todorov Hristov, College Park, MD (US); Oney O. Soykal, Silver Spring, MD (US)

(73) Assignees: University of Maryland, College Park, College Park, MD (US); The United States of America, as represented by the Director, National Security Agency, Washington, DC (US)

( * ) Notice: Subject to any disclaimer, the term of this patent is extended or adjusted under 35 U.S.C. 154(b) by 0 days.

(21) Appl. No.: 14/736,051

(22) Filed: Jun. 10, 2015

(65) Prior Publication Data

US 2015/0280124 A1 Oct. 1, 2015

Related U.S. Application Data

(62) Division of application No. 13/843,131, filed on Mar. 15, 2013, now Pat. No. 9,059,388.

(60) Provisional application No. 61/613,793, filed on Mar. 21, 2012.

(51) Int. Cl.
*H01L 49/00* (2006.01)
*H01S 5/04* (2006.01)
*B82Y 30/00* (2011.01)
*G10K 15/04* (2006.01)
*B82Y 20/00* (2011.01)

(52) U.S. Cl.
CPC .............. *H01L 49/006* (2013.01); *H01S 5/04* (2013.01); *B82Y 20/00* (2013.01); *B82Y 30/00* (2013.01); *G10K 15/04* (2013.01)

(58) Field of Classification Search
CPC ................................. H01S 5/04; H01L 49/006
See application file for complete search history.

(56) References Cited

U.S. PATENT DOCUMENTS

| 5,917,195 A * | 6/1999 | Brown ............................. 257/22 |
| 2013/0255906 A1 * | 10/2013 | Chang et al. ................. 165/11.1 |

OTHER PUBLICATIONS

Babic et al., "Modal reflection of quarter-wave mirrors in vertical-cavity lasers", IEEE J. Quantum Electronics, Jun. 1993, 29(6): pp. 1950-1962.
Bargatin et al., "Nanomechanical analog of a laser: Amplification of mechanical oscillations by stimulated zeeman transitions," Physical review letters, Sep. 2003, 91(13):138302.
(Continued)

*Primary Examiner* — Daivd Porta
*Assistant Examiner* — Hugh H Maupin
(74) *Attorney, Agent, or Firm* — Shapiro, Gabor and Rosenberger, PLLC

(57) ABSTRACT

An artificial composite object combines a quantum of sound with a matter excitation. A phonon in a confinement structure containing the matter excites it from an initial state to an excited state corresponding to a frequency of the phonon. Relaxation of the matter back to the initial state emits a phonon of the same frequency into the confinement structure. The phonon confinement structure, for example, a cavity, traps the emitted phonon thereby allowing further excitation of the matter. The coupling between the phonon and the matter results in a quantum quasi-particle referred to as a phoniton. The phoniton can find application in a wide variety of quantum systems such as signal processing and communications devices, imaging and sensing, and information processing.

25 Claims, 8 Drawing Sheets

(56) References Cited

OTHER PUBLICATIONS

Bourassa et al., "Ultrastrong coupling regime of cavity QED with phase-biased flux qubits," Phys. Rev. A, Sep. 2009, 80(3):032109.
Brunner, K., "Si/Ge nanostructures," Reports on Progress in Physics, 2002, 65: pp. 27-72.
Castner, Jr., T.G., "Raman spin-lattice relaxation of shallow donors in silicon", Physical Review, Apr. 1963, 130(1): pp. 58-75.
Chan et al., "Laser cooling of a nanomechanical oscillator into its quantum ground states," Nature, Oct. 2011, 478: pp. 89-92.
Chen et al., "Feasibility analysis of phonon lasers," IEEE Journal of Quantum Electronics, Apr. 2003, 39(4): pp. 600-607.
Cirac et al., "Quantum computations with cold trapped ions" Physical Review Letters, May 1995, 74(20): pp. 4091-4094.
Ciuti et al., "Input-output theory of cavities in the ultrastrong coupling regime: The case of time-independent cavity parameters," Physical Review A, Sep. 2006, 74(3):033811.
Ciuti et al., "Quantum vacuum properties of the intersubband cavity polariton field," Physical Review B, Sep. 2005, 72(11):115303.
Dicke, R.H., "Coherence in spontaneous radiation processes," Physical Review, Jan. 1954, 93(1): pp. 99-110.
Eichenfield et al., "Optomechanical crystals," Nature, Nov. 2009, 462(7269):pp. 78-82.
Eichenfield et al., "Optomechanical crystals," Nature, Supplementary Information, Nov 2009, pp. 1-18.
Ezzahri et al., "Coherent phonons in Si/SiGe superlattices," Physical Review B, May 2007, 75(19):195309.
Feranchuk et al., "Two-level system in a one-mode quantum field: numerical solution on the basis of the operator method," Journal of Physics A: Mathematical and General, 1996, 29: pp. 4035-4047.
Friesen, M., "Theory of the stark effect for p donors in Si," Physical Review Letters, May 2005, 94(18):186403.
Goicochea et al., "Thermal properties for bulk silicon based on the determination of relaxation times using molecular dynamics," Journal of Heat Transfer, Jan. 2010, 132(1):012401.
Greenland et al., "Coherent control of Rydberg states in silicon," Nature, Jun. 2010, 465: pp. 1057-1062.
Greentree et al.,"Quantum phase transitions of light," Nature Physics, Dec. 2006, 2(12): pp. 856-861.
Grudinin et al., "Phonon laser action in a tunable two-level system," Physical Review Letters, Feb. 2010, 104(8):083901.
Hasegawa, H. "Spin-lattice relaxation of shallow donor states in Ge and Si through a direct phonon process," Physical Review, Jun. 1960, 118(6): pp. 1523-1534.
Hausinger et al., "Qubit-oscillator system: an analytical treatment of the ultrastrong coupling regime," Physical Review A, Dec. 2010, 82(6):062320.
Hines et al., "Entanglement and bifurcations in Jahn-Teller models," Physical Review A, Aug. 2004, 70(2):022303.
Hu, X., "Two-spin dephasing by electron-phonon interaction in semiconductor double quantum dots," Oct. 2010, arXiv:1010.4093v3, [cond-mat. mes-hall].
Irish et al., "Dynamics of a two-level system strongly coupled to a high-frequency quantum oscillator," Physical Review B, Nov. 2005, 72(19):195410.
Irish, E.K., "Generalized rotating-wave approximation for arbitrarily large coupling," Physical Review Letters, Oct. 2007, 99(17):173601.
Jahn et al., "Stability of polyatomic molecules in degenerate electronic states. I. Orbital degeneracy," Proceedings of the Royal Society of London. Series A, Mathematical and Physical Sciences, Jul. 1937, 161(905):pp. 220-235.
Jaynes et al., "Comparison of quantum and semiclassical radiation theories with application to the beam maser," Proceedings of the IEEE, 2005, 51(1): pp. 89-109.
Kammerer et al., "Mid-infrared intersublevel absorption of vertically electronically coupled InAs quantum dots," Applied Physics Letters, 2005, 87:173113.
Kent et al., "Acoustic phonon emission from a weakly coupled superlattice under vertical electron transport: Observation of phonon resonance," Physical review Letters, Jun. 2006, 96(21):215504.
Khaetskii et al., "Spin-flip transitions between Zeeman sublevels in semiconductor quantum dots," Physical Review B, Sep. 2001, 64(12):125316.
Khan et al. "Fabrication and characterization of high-quality-factor silicon nitride nanobeam cavities," Optics Letters, Feb. 2011, 36(3): pp. 421-423.
Kimble, H.J., "Strong interactions of single atoms and photons in cavity QED," Physica Scripta, 1998, T76: pp. 127-137.
Kittel, C., "Phonon masers and the phonon bottleneck," Physical Review Letters, May 1961, 6(9): p. 449.
Kohn et al., "Theory of donor states in silicon," Physical Review, May 1955, 98(4): pp. 915-922.
Koiller et al., "Shallow-donor wave functions and donor-pair exchange in silicon: Ab initio theory and floating-phase Heitler-London approach," Physical Review B, Sep. 2004, 70(11):115207.
Krauss et al., "Coherent acoustic phonons in a semiconductor quantum dot," Physical Review Letters, Dec. 1997, 79(25): pp. 5102-5105.
Littlewood, P., "Condensates made of light", Science, May 2007, 316(5827): pp. 989-990.
Meaney et al., "The Jahn-Teller instability in dissipative quantum electromechanical systems," Mar. 2009, arXiv:0903.2681v1, [cond-mat.mes-hall].
Narayanamurti, V. "Phonon optics and phonon propagation in semiconductors," Science, Aug. 1981, 213(4509): pp. 717-723.
Porras et al., "Bose-Einstein condensation and strong-correlation behavior of phonons in ion traps," Physical Review Letters, Dec. 2004, 93(26):263602.
Rabl et al., "Strong magnetic coupling between an electronic spin qubit and a mechanical resonator," Physical Review B, Jan. 2009, 79(4):041302(R).
Ram et al., "Spontaneous emission in microcavities with distributed mirrors," IEEE J. Quantum Electronics, Feb. 1995, 31(2): pp. 399-410.
Ramdas et al.,"Spin-orbit coupling, mass anisotropy, time-reversal symmetry, and spontaneous symmetry breaking in the spectroscopy of shallow centers in elemental semiconductors," Solid State Communications, 2001, 117(3): pp. 213-222.
Regal et al., "Measuring nanomechanical motion with a microwave cavity interferometer," Nature Physics, Jul. 2008, 4(7): pp. 555-560.
Rempe et al., "Observation of quantum collapse and revival in a one-atom maser," Physical Review Letters, Jan. 1987, 58(4):pp. 353-356.
Safavi-Naeini et al., "Optomechanics in an ultrahigh-Q two-dimensional photonic crystal cavity", Applied Physics Letters, Nov. 2010, 97(18):181106.
Shaji et al., "Spin blockade and lifetime-enhanced transport in a few-electron Si/SiGe double quantum dot," Nature Physics, Jul. 2008, 4: pp. 540-544.
Smelyanskiy et al., "Quantum computing on long-lived donor states of Li in Si," Physical Review B, Aug. 2005, 72(8):081304(R).
Soykal et al., "Phonitons as a sound-based analogue of cavity quantum electrodynamics, Version 1" Jun. 2011, arXiv:1106.1654v1 [cond-mat.mes-hall].
Soykal et al., "Phonitons as a sound-based analogue of cavity quantum electrodynamics, Version 2" Nov. 2011, arXiv:1106.1654v2 [cond-mat.mes-hall].
Tahan et al., "Decoherence of electron spin qubits in Si-based quantum computers," Physical Review B, Jul. 2002, 66(3):035314.
Tahan, C.G.,"Silicon in the quantum limit: Quantum computing and decoherence in silicon architectures," Dissertation, University of Wisconsin—Madison, 2005.
Trigo et al., "Confinement of acoustical vibrations in a semiconductor planar phonon cavity," Physical Review Letters, Nov. 2002, 89(22):227402.
Vuckovic et al., "Optimization of three-dimensional micropost microcavities for cavity quantum electrodynamics," Physical Review A, 2002, 66: 023808.
Wang et al., "Thermal logic gates: Computation with phonons," Physical Review Letters, Oct. 2007, 99(17): 177208.

(56) References Cited

OTHER PUBLICATIONS

Wilson et al., "Electron spin resonance experiments on donors in silicon. III. Investigation of excited states by the application of uniaxial stress and their importance in relaxation processes," Physical Review, Nov. 1961, 124(4):pp. 1068-1083.

Wilson-Rae et al., "Quantum dot cavity-QED in the presence of strong electron-phonon interactions," Physical Review B, May 2002, 65(23):235311.

Winter et al., "Selective optical generation of coherent acoustic nanocavity modes," Physical Review Letters, Jun. 2007, 98(26):265501.

* cited by examiner

PHONITON SYSTEMS, DEVICES, AND METHODS

CROSS-REFERENCE TO RELATED APPLICATIONS

This application is a divisional of U.S. application Ser. No. 13/843,131, filed Mar. 15, 2013, which claims the benefit of U.S. Provisional Application No. 61/613,793, filed Mar. 21, 2012, both of which are hereby incorporated by reference herein in their entireties.

STATEMENT REGARDING FEDERALLY SPONSORED RESEARCH

This invention was made with government support under H9823006C0401 awarded by the National Security Agency (NSA). The government has certain rights in the invention.

FIELD

The present disclosure relates generally to quantum systems, and, more particularly, to systems, methods, and devices, for generating and using a single cavity phonon mode coupled with a single matter excitation, also known as a phoniton.

SUMMARY

An artificial, composite particle can be composed of a cavity phonon mode coupled with a matter excitation in the solid-state. In an example, the device can include a semiconductor phonon microcavity (e.g., formed from an epitaxially grown silicon-germanium micro-pillar heterostructure or similar) with an impurity (e.g., phosphorus atom, lithium atom, or other solid-state two-level system such as, but not limited to, a quantum dot) placed at a node or antinode of the trapped acoustic phonon. The cavity phonon energy is resonant with the energy level splitting of the impurity. Phonitons (i.e., cavity phonon plus matter excitation) are created either by exciting the impurity or adding a phonon (e.g., electrically, thermally, optically, or by tunneling). The interaction strength, phonon lifetime, and matter excitation lifetime are such that the cavity phoniton is in the strong coupling regime. The cavity phoniton can be employed in a variety of devices, such as, but not limited to, single phonon sources, phonon delays and switches, phonon logic, imagers and sensors, phonon lasing, and a solid sound device.

In one or more embodiments of the disclosed subject matter, a quantum device can include a quantum two-level system within a cavity. A single cavity phonon mode can be coupled to the quantum two-level system. The cavity can be a phonon cavity or mechanical cavity. The two-level system can be formed from two appropriate energy levels of an otherwise multi-level system (e.g., an impurity atom or a quantum dot). These two energy levels (e.g., the two lowest energy levels of the two-level system) can be referred to as a first energy state and a second energy state of the two-level system. The cavity phonon mode can have a wavelength (as well as frequency, energy, polarization and/or other mode indices) such that the energy of the phonon in the cavity is resonant (or near resonant) with a transition of the two-level system between the first and second energy states.

The quantum two-level system can be an impurity embedded in a semiconductor material. Alternatively, the quantum two-level system can be an impurity, a defect, or a color center in crystalline carbon, such as diamond, a carbon nanotube, graphene, or fullerene. In yet another alternative, the quantum two-level system can be a quantum dot. The cavity can be configured to trap the phonon therein, with the quantum two-level system disposed at an anti-node or a node of the phonon. The phonon can be coupled to the quantum two-level system such that the coupling rate between the phonon and the two-level system is greater than losses associated with the cavity phonon mode and the two-level system. The phonon can have a frequency in the terahertz regime or lower.

In one or more embodiments of the disclosed subject matter, a phoniton device can include a crystalline host and at least one two-level system. The crystalline host can have a phonon confinement structure. The at least one two-level system can be within the phonon confinement structure of the crystalline host and can have at least first and second energy states. The phonon confinement structure can be configured to direct phonons to the at least one two-level system such that the energy of the phonons within the confinement structure corresponds to a transition frequency at or near a difference between the first and second energy states of the at least one impurity.

The at least one two-level system can include a donor, an acceptor, a defect (e.g., a vacancy center), a color center (e.g., a coupled vacancy plus impurity center, such as a nitrogen vacancy center in diamond), and/or a quantum dot. The phonon confinement structure can be configured to trap the phonon therein such that an antinode or a node of the phonon is at a position of the at least one impurity. The at least one two-level system can be a plurality of two-level systems within the same phonon confinement structure, for example, constituting a linear or two-dimensional array, which array can be ordered or random. Alternatively or additionally, the phonon confinement structure can include a plurality of cavities, with at least one impurity in each cavity. The phonon confinement structure may be configured such that phonons can tunnel between adjacent cavities.

The phonon confinement structure can include a cavity with a reflector that at least partially reflects phonons from the cavity back into the cavity. The phonon confinement structure may be configured to allow partial escape of phonons in a coherent and directional manner. The phoniton device may be configured as a sensor, a phonon detector, a phonon source, or any other type of quantum device, such as, but not limited to, phonon lasers, signal processing components, terahertz (THz) imagers, switches, logic devices, and quantum information processing devices.

For example, the crystalline host can include a semiconductor region that is a Group III-V or Group II-IV semiconductor. The semiconductor region can be arranged between respective superlattices as portions of the phonon confinement structure. The superlattices can be formed of Group III-V or Group II-IV semiconductors different from those of the semiconductor region. The at least one impurity can be a donor atom or an acceptor atom.

In another example, the crystalline host can include a semiconductor region that is arranged between respective superlattices, which function as portions of the phonon confinement structure. The semiconductor region can include silicon or a Group IV semiconductor as a main component. The superlattices can be formed of silicon-germanium or a Group IV semiconductor different from that of the crystalline host. In such a host, the at least one two-level system can be a donor atom, such as a phosphorus atom or a lithium atom.

In still another example, the crystalline host can be diamond, and the at least one two-level system can be a color center and/or defect. In yet another example, the crystalline host can be a carbon nanotube, a graphene sheet, or fullerene, and the at least one two-level system can be a donor atom, an acceptor atom, or a defect. In a further example, the crystalline host can be a levitating semiconductor nanocrystal or a three-dimensional (3D) spherical quantum dot, and the at least one two-level system can be a donor atom or an acceptor atom contained therein.

In still another example, the crystalline host can be a planar membrane having an array of holes therein as portions of the phonon confinement structure. In such a host, the two-level system can be an acceptor atom (e.g., boron, aluminum, or indium) or a donor atom within the planar membrane. The array of holes can be periodic or aperiodic.

In one or more embodiments of the disclosed subject matter, a method for producing a phoniton can include trapping a phonon in a cavity, and coupling the trapped phonon to a quantum two-level system in the cavity. The quantum two-level system can have a first energy state and a second energy state. The phonon can be coupled such that the phonon energy in the cavity corresponds to a transition frequency at or near a difference between the first and second energy states. The quantum two-level system can be arranged at an anti-node or a node of the trapped phonon.

The quantum two-level system can be a solid-state two-level system. For example, the two-level system can include one or more of a donor, an acceptor, a color center, a defect, and a quantum dot. In another example, the two-level system can include an electron gas, a hole gas, or a quantum well.

The coupling can be such that a coupling rate between the phonon and the two-level system is in the strong coupling regime. The trapped phonon can be coupled to the quantum two-level system such that the coupling rate between the phonon and the quantum two-level system is greater than losses associated with the cavity (e.g., donor relaxation and cavity loss rates). The phonon can have a frequency in the THz regime or lower.

The method can further include providing a crystalline-based device containing the quantum two-level system and the resonant cavity. Prior to the trapping, the phonon can be generated external to the resonant cavity and provided thereto, or the phonon can be generated by the quantum two-level system using at least one of electrical generation, thermal generation, optical generation, or tunneling. The method can further include altering at least one of the first and second energy states such that the transition amplitude or transition probability between them is changed. The altering can include at least one of straining the material, applying an electric field, or applying a magnetic field. Alternatively or additionally, the method can further include altering a resonant frequency of the cavity such that the phonon energy in the cavity no longer corresponds to a transition frequency at or near the difference between the first and second energy states.

In one or more embodiments of the disclosed subject matter, a method for producing a phoniton can include (a) providing a two-level system in phonon confinement structure, the impurity having first and second energy states, a transition between the first and second energy states corresponding to a particular phonon mode, and (b) interacting a first phonon with the two-level system so as to cause a transition of the two-level system from the first energy state to the second energy state. The method can further include (c) generating a second phonon by allowing the two-level system to transition from the second energy state to the first energy state, and (d) re-directing the second phonon by way of the phonon confinement structure so as to interact with the two-level system to cause another transition of the two-level system from the first energy state to the second energy state. The method can further include repeatedly performing (c) and (d).

The two-level system can include an impurity, a donor, an acceptor, a color center, a defect, and/or a quantum dot. Each of the first and second phonons can have the particular phonon mode in the phonon confinement structure. The phonon confinement structure can include a reflector adjacent to a cavity containing the two-level system therein. The re-directing can include reflecting the second phonon back to the two-level system by way of the reflector. Additionally or alternatively, the phonon confinement structure can include a periodic or aperiodic array of holes in a crystalline host material containing the two-level system. The re-directing can include reflecting the second phonon back to the two-level system by way of the array of holes in the crystalline host material.

Objects and advantages of embodiments of the disclosed subject matter will become apparent from the following description when considered in conjunction with the accompanying drawings.

BRIEF DESCRIPTION OF THE DRAWINGS

Embodiments will hereinafter be described in detail below with reference to the accompanying drawings, wherein like reference numerals represent like elements. The accompanying drawings have not necessarily been drawn to scale. Where applicable, some features may not be illustrated to assist in the description of underlying features.

DETAILED DESCRIPTION

Figure 1:
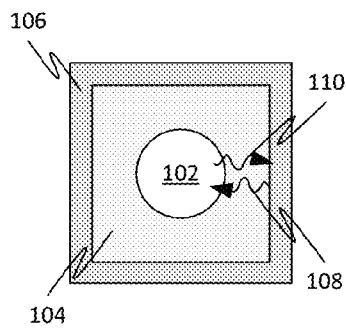
FIG. 1 is a schematic diagram showing generalized components of a quantum phoniton device, according to one or more embodiments of the disclosed subject matter.

Embodiments of the disclosed subject matter relate to various devices and systems that generate and/or use a phoniton as well as methods for generating and/or using a phoniton. As used herein, phoniton refers to a quantum quasi-particle that results from the coupling between a phonon within a confinement structure (e.g., a phonon cavity or mechanical cavity) and a matter excitation contained in the confinement structure, in particular, the combination of a single two-level system with a single confined phonon mode that are coupled via the electron-phonon interaction.

As used herein, two-level system (TLS) refers to an otherwise multi-level quantum system that may be embedded in a host material (e.g., a crystalline material such as single crystal silicon) and has two appropriate energy levels (e.g., the lowest two energy levels) of the multi-level system useful for phonon generation. Examples of a TLS include, but are not limited to, a donor atom (e.g., phosphorus or lithium) in a silicon host material and an acceptor atom (e.g., boron, aluminum, or indium) in silicon host material. Other non-exhaustive examples of TLSs are provided herein. The TLS can be tuned using, for example, an external magnetic field, an external electric field, and/or a mechanical strain. When the strong coupling regime is established, the whole phoniton system can be tuned, for example to an external phonon waveguide.

The cavity phonon mode can have a wavelength (as well as frequency, energy, polarization and/or other mode indices) such that the energy of the phonon in the cavity is resonant (or near resonant) with a transition of the TLS between the lowest two energy states (or other relevant energy states corresponding to phonon relevant frequencies). Strong coupling between a phonon and the transition between the two energy levels of the TLS can be achieved by appropriate configuration and construction of a quantum device, as described in further detail herein. Moreover, devices employing acceptors as the TLS can provide dispersive coupling, in particular strong dispersive coupling in the "good cavity" limit or "bad cavity" limit, as described herein.

The energy eigenstates of the phoniton are hybrid states of the TLS (i.e., two levels) and of the equidistant energy states of the confined phonon mode (i.e., an infinite number). The combined phoniton energy spectrum is thus an infinite set of non-equidistant levels with characteristic Rabi splitting. Such a non-linear spectrum can be achieved by using phonons (in particular, a confined phonon mode) as mediators. As used herein, confined phonon mode refers to a standing acoustic phonon mode (or, in general, an optical phonon mode) confined in an appropriate phonon cavity.

In a non-limiting example of a phonon cavity, a silicon micro-pillar cavity can be sandwiched between a pair of reflectors in the form of acoustic phonon distributed Bragg reflectors. Such a configuration results in a quasi-1D phononic band gap cavity. The micro-pillar phononic cavity can be constructed with appropriate materials, dimensions, and other characteristics such that the device operates in the strong coupling regime. In another non-limiting example of a phonon cavity, a silicon nano-membrane can have a periodic arrangement of holes in two-dimensions (2D). The cavity is formed as a plain region (i.e., without any holes) of the membrane. In other words, the cavity is formed by a region of the membrane where the 2D periodicity of the hole arrangement is altered or violated. Such a configuration results in a quasi-2D phononic band gap cavity.

As used herein, strong coupling regime refers to the state where the coherent exchange (g) is faster than the loss rate of the TLS coherence alone and is faster than the loss rate of the confined phonon mode. The ability of a quantum coherent exchange within a time scale defined by the inverse loss rates allows the phoniton to be used as a new element of quantum circuit architecture. When the phoniton is designed to operate in the strong coupling regime, it can be used, for example, as a quantum computing component with characteristics matching or exceeding those of existing circuit QED systems.

As used herein, weak coupling regime refers to the state where the coherent exchange is slower than the loss rate of the TLS coherence and is slower than the loss rate of the confined phonon mode. While the quantum coherent exchange is not direct in the weak coupling regime, a phoniton device operating in such a regime can be used as a single phonon source.

As used herein, resonance (or resonant phoniton system) refers to the regime where the TLS energy splitting is equal to the energy splitting of the confined phonon mode. In a quasi-resonant regime, the TLS can be slightly frequency detuned from the cavity, or vice versa. As used herein, the quasi-resonant regime exists if the detuning, $\Delta$, is given by $$\Delta = \Omega_{TLS} - \Omega_{cavity} < \frac{\Gamma_{TLS} + \kappa_{cavity}}{2},$$

where $\Omega_{TLS}$ is the transition frequency of the TLS, $\Omega_{cavity}$ is the cavity frequency, $\Gamma_{TLS}$ is the loss rate of the TLS, and $\kappa_{cavity}$ is the loss rate of the cavity. In other words, the condition of near resonance (or quasi-resonance or near a transition between energy states of the TLS) refers to the regime where the TLS-cavity mode detuning is less than the average loss rate of the phonon cavity and the TLS.

As used herein, dispersive (or dispersive phoniton system) refers to the regime where the TLS energy (or frequency) detuned from the cavity strongly exceeds the coupling rate (g). Thus, the amount of detuning $\Delta >>> g$. In this regime, the effective TLS-cavity coupling is referred to as dispersive coupling ($\chi$) and is given by $$\chi = \frac{g^2}{\Delta}.$$

Nano-membrane cavity systems employing an acceptor atom as a TLS can be used to generate such a phoniton in the dispersive coupling regime.

Referring to FIG. 1, a simplified diagram of general components of a device for generating and/or using a phonon is shown. The device can include a confinement structure 106 that defines a cavity region 104 containing a quantum two-level system (TLS) 102 therein. The cavity region 104 may take the form of a crystalline host, for example, an elemental or compound semiconductor material, such as a Group IV semiconductor (e.g., Si), a Group III-V semiconductor (e.g., GaAs), or a Group II-VI semiconductor (e.g., CdTe). Alternatively or additionally, the crystalline host can be a crystal form of carbon, such as diamond, a carbon nanotube, a graphene sheet, or a fullerene.

The confinement structure can include various features that direct a phonon 108 of a particular frequency to the TLS 102 for interaction therewith. The confinement structure 106 may have portions that serve to define the cavity region 104 while other portions serve to re-direct emitted or incoming phonons to the TLS 102. For example, the confinement structure 106 can include reflectors (e.g., acoustic distributed Bragg reflectors (DBR)) that reflect an emitted phonon 110 back toward the TLS 102. Other features that serve to delimit the cavity region 104 can be considered as part of the confinement structure. A micro- or nano-pillar structure for the cavity 104 sandwiched between top and bottom DBR reflectors can thus serve as the confinement structure. In another example, the confinement structure 106 can be a nanomembrane that includes an array (periodic or aperiodic) of holes. In still another example, the configuration of the crystalline host material (e.g., as diamond, a carbon nanotube, graphene sheet, or fullerene) may simultaneously define a cavity region 104 and channel phonons to a TLS contained therein. In other words, features that serve to define the cavity region 104 or to channel phonons to the TLS 102 can be part of the confinement structure 106.

Embodiments illustrating such examples are explained in further detail below. However, embodiments of the confinement structure are not limited to the specific examples illustrated and discussed herein; rather, other configurations for the confinement structure are also possible according to one or more contemplate embodiments, so long as the configurations are capable of the phonon channeling and/or trapping described herein. Moreover, although certain materials have been discussed for the DBR reflectors, other materials are also possible according to one or more contemplated embodiments. For example, when the crystalline host is a Group III-V or Group II-VI semiconductor region, the superlattices may be formed of other Group III-V or Group II-VI semiconductor layers. In another example, when the crystalline host is silicon or a Group IV semiconductor region, the superlattices may be formed of silicon-germanium or other Group IV semiconductor layers that is different from the crystalline host.

The TLS 102 can have at least two energy states, for example, an initial unexcited first state and an excited second state. Interaction of the TLS 102 with a phonon 108 of a particular wavelength and mode causes the TLS 102 to transition from the first state to the excited state. Relaxation of the TLS 102 back to the first state results in emission of the phonon 110, which can have the same wavelength and mode as phonon 108, into cavity region 104. Confinement structure 106 redirects the phonon 110 back to the TLS 102, thereby allowing repeated interaction between the TLS 102 and the phonon. The strong coupling between the phonons and the TLS 102 results in the phoniton.

As explained in more detail below, the TLS 102 is chosen such that the transition between the initial first state and the excited second state corresponds to phonon frequencies of interest, in particular, phonon modes and frequencies that are trapped by the confinement structure 106. The TLS 102 can thus be strongly coupled to a particular phonon mode in the cavity region 104, so long as the coupling rate (g) between the phonon and the TLS is much larger than the TLS relaxation ($\Gamma$) and associated cavity loss rates ($\kappa$). The TLS 102 can be provided in a crystalline host (e.g., a semiconductor or crystalline carbon) and be a different material from the crystalline host.

For example, the TLS can be an impurity, such as a donor atom or an acceptor atom, in a semiconductor material. In another example, the TLS can be a semiconductor quantum dot, or the TLS can be a donor atom or an acceptor atom in a semiconductor nanocrystal or quantum dot. In still another example, the TLS can be a color center or defect in the crystalline structure of diamond. In yet another example, the TLS can be a donor atom, an acceptor atom, or defect in the crystalline structure of a carbon nanotube, graphene sheet, or fullerene. Embodiments illustrating such examples are explained in further detail below. However, embodiments of the TLS system are not limited to the specific examples illustrated and discussed herein; rather, other configurations for the TLS are also possible according to one or more contemplated embodiments, so long as the configurations are capable of the phonon-relevant energy level splitting described herein.

Figure 2:
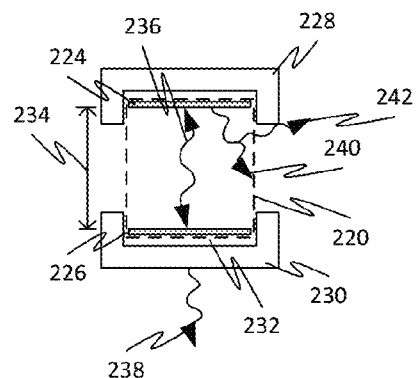
FIG. 2 is a schematic diagram of a quantum two-level system in a cavity in a quantum phoniton device, according to one or more embodiments of the disclosed subject matter.

FIG. 2 is a simplified illustration of a TLS 240 in a cavity 232 to assist in describing certain aspects of the disclosed subject matter. In particular, TLS 240 can have a first level 226 and a second level 224, which are separated by an energy amount shown as 234. Cavity 232 may be defined by a first reflector 228 and a second reflector 230 that is designed to preferentially trap a single phonon mode (e.g., a longitudinal or transverse mode) at a given wavelength ($\lambda$). The TLS 240 can be disposed at a node or anti-node of the phonon mode trapped within cavity 232, the interaction with the phonon 236 causing transition of the TLS between the first level 226 and the second level 224. For the coupling between the phonon 236 and the TLS 240 to generate a phoniton, the transition matrix element between levels 224 and 226 should be dominated by the cavity phonon field 236 and not by other transitions, such as photon transitions. Moreover, for strong coupling between the phonon 236 and the TLS 240, the coupling rate (g) should be greater than loss rates associated with the device, for example, TLS relaxation (Γ) 240, cavity loss rate (κ) 238, and phonon anharmonicity (anh) 242.

Silicon's unique band structure allows for a transition that is solely phonon coupled and at an energy such that a practical device is possible. In the case of the phosphorous donor in silicon, the lowest valley states (A1 and T2 in FIG. 3) are the active levels; their energy splitting can be controlled by the amount of strain that the silicon is under (due to the relaxation level of the substrate layer). This can in principle be tuned from 11 meV at zero strain to 3 meV at high strains.

Figure 3:
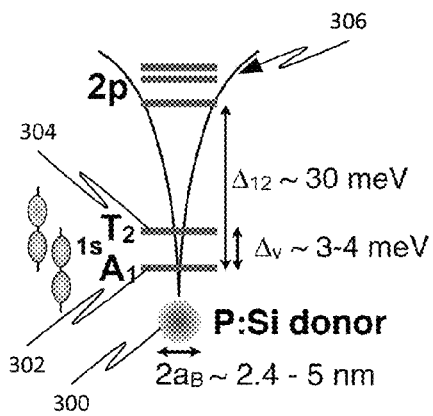
FIG. 3 is an energy level diagram illustrating the splitting between energy levels for cavity phoniton generation, according to one or more embodiments of the disclosed subject matter.
Figure 4:
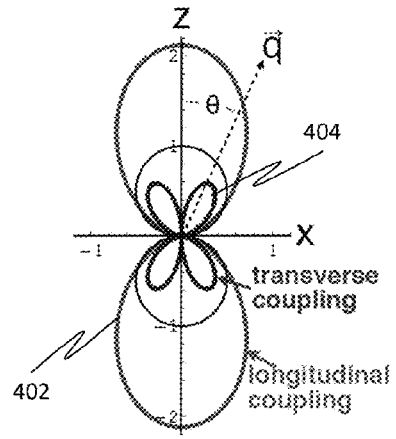
FIG. 4 is a diagram illustrating the angular dependence of transverse and longitudinal coupling modes of a phonon in a cavity, according to one or more embodiments of the disclosed subject matter.

The six-fold degeneracy due to silicon's multi-valley conduction band is lifted both by applied strain (e.g., due to the lattice mismatch with a substrate) and the sharp donor potential. For example, for a [001] compressively strained silicon region, the first excited state at zero magnetic field of a phosphorous donor 300 (i.e., the TLS in the silicon cavity) approaches a second energy level, 304, wherein the difference from the lowest energy level 302 to the second energy level 304 may be $\Delta_v^P \simeq 3.02$ meV (0.73 THz), as shown in FIG. 3. The second energy level 304 may be a so-called excited "valley" state. The excited valley state 304 can have an s-like envelope function like the ground state but opposite parity. Because of this, valley state relaxation times can be much longer than for charge states. Energy splitting (i.e., the difference between the first energy level 302 and second energy level 304) can be controlled by the applied strain to the cavity containing the TLS. FIG. 4 shows the angular dependence of the coupling frequency, $g_q(\theta)$ for deformation potentials. The energy splitting implies longitudinal (transverse) wavelengths of $\lambda_l \approx 12.3$ nm ($\lambda_t \approx 7.4$ nm). For comparison, the energy splitting to the upper 2p-like state is greater than 30 meV, which corresponds to a wavelength of about 1.2 nm and is unlikely to be amenable to phonon cavities. Since the P:Si Bohr radius is $a^*_B \lesssim 2.5$ nm in the bulk, $\lambda > a^*_B$ allows for easier TLS particle placement (e.g., donor placement), avoiding of interface physics, and substantially bulk-like wave functions.

Figure 5:
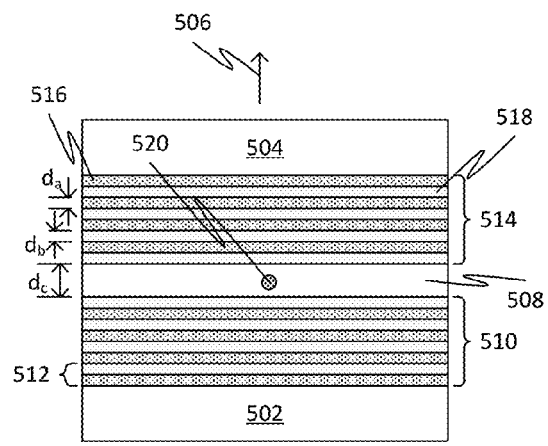
FIG. 5 is a cross-sectional view of a solid state quantum phoniton device, according to one or more embodiments of the disclosed subject matter.

Referring to FIG. 5, an embodiment of a phoniton device having a silicon heterostructure is shown. To create the TLS, an impurity 520 is placed at the antinode (or a node) of an acoustic phonon trapped in a silicon phonon cavity 508. A strained silicon phonon cavity 508 can be grown in the [001] direction (referenced as 506). The phonon cavity 508 can have a length or thickness, $d_c$, that is approximately equal to a desired phonon wavelength, λ. The cavity 508 can have a lateral size (i.e., in a plane perpendicular to the page of FIG. 5), D, that is enclosed by a first acoustic distributed Bragg reflector (DBR) 510 and a second DBR 514. The cavity length can be chosen to be less than a critical thickness due to strain.

Each DBR 510, 514 can be formed as layered, epitaxially-grown, and strain-relaxed silicon-germanium (SiGe) superlattice (SL) heterostructures, in particular, repeating pairs 512 of individual layers. The DBR SL unit period 512 can have a first layer 516 (A layer) and a second layer 518 (B layer), where the A layers are formed of $Si_{1-x}Ge_x$ and have a thickness of $d_a$, and the B layers are formed of $Si_{1-y}Ge_y$ and have a thickness of $d_b$, where x is different than y. Although a particular number of unit layers 512 have been shown in FIG. 5, practical embodiments are not limited to this number of layers 512 and greater or fewer layers 512 than shown in FIG. 5 are also possible. The layers 516, 518 can be strain matched to a substrate 502, which may be a $Si_{1-s}Ge_s$ substrate. For example, x can be 0.55, y can be 0.05, and s can be 0.26. An appropriate capping layer 504 can be provided on the second DBR 514, depending on the phonon mode that is actually confined in cavity region 508.

In the case of micropillar DBR (mpDBR) structures, which are designed to increase the phonon-TLS coupling, the DBR lateral dimension may become comparable to the phonon wavelength (i.e., $D \gtrsim d_c \sim \lambda$). The confined mode can then be a mixed longitudinal/transverse one. The trapped mode with wavelength $\lambda_q$ and phase velocity $v_q$ can be designed to be resonant in energy with the first excited state of the TLS (e.g., the phosphorus donor atom). The thickness of the SL unit cell 512 can be set to match the Bragg condition, i.e., $$d_{a,b}^{(q)} = v_{a,b}^{(q)} \lambda_q / 4 v_q,$$

where $v_{a,b}^{(q)}$ represents the phase velocities using an isotropic approximation. The TLS system (e.g., donor atom 520) can be placed at the center of the cavity 508 (e.g., having thickness $d_c = \lambda_q$) such that the displacement u(r) is maximal.

In the semi-classical picture, an acoustic phonon creates a time-dependent strain, $$\varepsilon_{\alpha\beta}(r) = \frac{1}{2}\left(\frac{\partial u_\alpha}{\partial r_\beta} + \frac{\partial u_\beta}{\partial r_\alpha}\right),$$

which modulates the energy bands and can drive transitions in a localized state, e.g., a donor. For silicon, from the multi-valley electron-phonon interaction, the matrix element between valley states, $\langle s, i |$, can be derived as:

$$V_{ij}^{s's} \equiv \hbar g_q = i\left\langle s', i \left| \Xi_d Tr(\varepsilon_{\alpha\beta}) + \frac{1}{2}\Xi_u\left\{\hat{k}_i^\alpha \hat{k}_i^\beta + \hat{k}_j^\alpha \hat{k}_j^\beta\right\}\varepsilon_{\alpha\beta} \right| s, j\right\rangle \quad (1)$$

where $\hat{k}_{i,j}$ are the directions toward the valleys; s, s' label the orbital (envelope) function(s), and $\Xi_d$ (Si)≈5V are deformation potential constants. For the donor-phonon Hamiltonian, the interaction (of Jaynes-Cummings type) becomes $H_g \approx \hbar \, g_q(\sigma_{ge}^+ b_{q,o} + \sigma_{ge}^- b_{q,o}^\dagger)$, where only the resonant cavity phonon with quantum numbers q, σ and energy $\hbar \, \omega_{q,o}$ is retained, $b_{q,o}^\dagger$ is the phonon creation operator, and $\sigma_{ge}^+ \equiv |e\rangle\langle g|$ refers to the donor transition between ground and excited states. In the loss part, $H_{loss} = H_k + H'_{anh} + H_\Gamma$, where $H_k$ (for example, see 238 in FIG. 2) couples the cavity mode to external continuum of other modes giving a cavity decay rate of $\kappa = \omega_{q,o}/Q$ (expressed through the Q-factor), and $H'_{anh}$ includes phonon decay (for example, see 242 in FIG. 2) due to phonon self-interaction and also phonon scattering off impurities (e.g., primarily due to mass fluctuations in natural silicon). The coupling of the TLS (e.g., donor atom) to modes other than the cavity mode, $H_\Gamma$, leads to its spontaneous decay.

The valley states $1s(A_1)$, $1s(T_2)$ that make up the TLS are the symmetric and anti-symmetric combinations of the conduction band valley minima along the ẑ-direction (see FIG. 3). Due to opposite parity of the states the intravalley contributions cancel. The intervalley transitions are preferentially driven by Umklapp phonons with a wave vector q at $$q_u \simeq 0.3 \frac{2\pi}{a_o},$$

where $a_u \equiv G_{+1} - 2k_{\hat{z}}$ is the wave vector "deficiency" of the intervalley $k_{\hat{z}} \to -k_{\hat{z}}$ transition, and $$G_{+1} = \frac{4\pi}{a_o}(0, 0, 1)$$

is the reciprocal vector along $\hat{z}$. Since typical values give $q_u r \approx q_u a_B^* \simeq 9.4 > 1$ and $qr \sim 1$ for 3 meV, the coupling can be calculated exactly (without using a dipole approximation) for longitudinal and transverse polarizations as:

$$g_q^{(\sigma)} = \left(\frac{a_G^2 q^2}{2\rho \hbar V \omega_{q,\lambda}}\right)^{\frac{1}{2}} I^{ge}(\theta) \begin{cases} \Xi_d + \Xi_u \cos^2\theta & [l] \\ \Xi_u \sin\theta\cos\theta & [t] \end{cases}, \quad (2)$$

where $a_G \approx 0.3$, $$I^{ge}(\theta) = \int dr [\Phi_{1s}^{\hat{z}}(r)]^2 e^{-iqr} \sin(q_u r) = \frac{2\beta_q \cos\theta(1 - \gamma_q \cos^2\theta)}{\alpha_q^2[(1 - \gamma_q \cos^2\theta)^2 - \beta_q^2 \cos^2\theta]^2}$$

is the intervalley overlapping factor, $$\alpha_q = 1 + \frac{1}{4}(q^2 a^2 + q_u^2 b^2), \quad \beta_q = \frac{1}{2\alpha_q} b^2 q q_u, \quad \gamma_q = \frac{1}{4\alpha_q}(a^2 - b^2) q^2,$$

and a/b are the radii of the Kohn-Luttinger envelope function $\Phi_{1s}^{\hat{z}}(r)$. The calculated coupling is to plane wave modes, related to a rectangular cavity with periodic boundary conditions. FIG. 4 shows the directionality of the coupling for longitudinal and transverse phonons. The angular dependence in Eq. (2) for longitudinal phonons is similar to dipole emission ($I_{dip}^{ge} \sim \cos\theta$), but enhanced in a cone around $\hat{z}$-direction due to non-dipole contributions. Uncertainties in $\Xi_d$ calculations result in an overall factor of two difference in the maximal coupling.

With respect to coupling to the cavity mode, the matrix element $\hbar g_q^{(o)}$ represents the interaction energy of the donor with the "phonon vacuum field" and expresses a generic dependence $\propto 1/\sqrt{V}$ on the normalization volume. For large volumes, the matrix element approaches zero. In a cavity, V is the physical volume of the mode. By virtue of Eq. (2), a DBR cavity can be considered with a length $d_c = \lambda_l \simeq 12.3$ nm designed for longitudinal resonant phonon along the z-direction. For isotropic velocities for silicon, the following values can be used: $v_l = 8.99 \times 10^3$ m/s, $v_t = 5.4 \times 10^3$ m/s. Taking the minimal lateral size $D_{min} \approx \lambda_l$ to ensure $D > 2a_B^* \approx 5$ nm results in a mode volume of $V_{min} \approx \lambda_l^3$ for P:Si. Thus, the maximal phonon-donor coupling can be estimated as $g_{1\lambda} = 3.7 \times 10^9$ s$^{-1}$. For D=5λ, the coupling is still appreciable: $g_{5\lambda} = 7.4 \times 10^8$ s$^{-1}$. Surface undulation typical of step-graded SiGe quantum wells gives $D \approx 200$ nm≲15λ, though this interface imperfection is avoidable with heterostructures grown on defect-free nanomembrane substrates.

For a realistic cylindrical mpDBR cavity, the modes can be constructed as standing waves with energy, $\hbar\omega$, and wave number, q, along the pillar z-direction, with stress-free boundary conditions on the cylindrical surface. The displacements for compressional modes are: $u_r$, (r, z)=[$A_r J_1(\eta_l r)$+$B_r J_1(\eta_t r)$] sin qz, $u_z$ (r,z)=[$A_z J_0(\eta_l r) + B_z J_0(\eta_t r)$] cos qz where $J_{0,1}$(r) are Bessels of 1st kind, $\eta_{l,t} = \sqrt{\omega^2/v_{l,t}^2 - q^2}$, and $A_i$, $B_i$ are constants. These modes are lower in energy and couple strongly to the donor. The related strain has a node at the Si-cavity z-boundaries (for λ-cavity)

For a fixed resonant frequency ω and lateral size D, the dispersion relation $q = \omega/v_q(D)$ has multiple solutions $q_i$, i=0, 1, 2, . . . , where $q_0$ stands for the fundamental mode, $q_1$ for the $1^{st}$ excited mode, etc. Each mode propagates with its own phase velocity, $v_{q_i}(D) \neq v_l, v_t$. For a λ-cavity and D=$\lambda_l$, Eq.(1) yields maximal coupling to the fundamental mode with $\lambda_{q_0}$=6.9 nm to be $g_{1\lambda}^{(0)} = g_{max} = 6.5 \times 10^9$ s$^{-1}$. As illustrated in Table 1, such a value is comparable to the above estimation. For larger D, however, the coupling to the fundamental mode rapidly decreases (e.g., $g_{5\lambda}^{(0)} = 5.8 \times 10^5$ s$^{-1}$) since the mode transforms to a surface-like Rayleigh wave ($v_{Rayleigh} < v_t$). Coupling to higher mode branches is appreciable and decreases roughly as $$\frac{1}{\sqrt{V}},$$

e.g., for the 1st mode branch, $g_{1\lambda}^{(1)} = 2.4 \times 10^9$ s$^{-1}$ and $g_{5\lambda}^{(1)} = 3 \times 10^8$ s$^{-1}$. Among various mode choices, for any diameter D there is a higher excited mode with resonant wavelength close to that for longitudinal phonons, e.g., for D=3$\lambda_l$, the wavelength of the resonant $4^{th}$ excited mode is $\lambda_{q_4} \simeq 12.4$ nm and the coupling $g_{3\lambda}^{(4)} = 3 \times 10^9$ s$^{-1}$, which values are similar to the rectangular DBR estimate.

Losses in the disclosed phoniton system are dominated by donor relaxation and leakage of the confined phonon mode. Donor relaxation, $\Gamma_{relax}$, to modes different than the cavity mode (and generally not trapped into the cavity) is bounded by the donor spontaneous emission rate in the bulk: $\Gamma_{relax} \lesssim \Gamma$. The bulk donor relaxation to longitudinal and transverse phonons can be calculated as $\Gamma_{ge}^{(l)} = 3 \times 10^7$ s$^{-1}$ and $\Gamma_{ge}^{(t)} = 9.2 \times 10^7$ s$^{-1}$, respectively, for the 3 meV transition ($\Gamma = \Gamma_{ge}^{(l)} + \Gamma_{ge}^{(t)} = 1.2 \times 10^8$ s$^{-1}$). The relaxation to photons is electric dipole forbidden and suppressed by $(\lambda_{photon}/a_B^*)^2 \sim 10^{10}$.

The cavity mode loss rate is calculated as mainly due to leakage through the DBR mirrors, similar to optical DBR cavities except that for phonons there is no leakage through the sides. Generally, for the cylindrical micropillar DBRs, the cavity mode involves coupled propagation along the micropillar of two displacement components, $u_z$(r, z), $u_r$(r, z), and two stress fields, $T_{ZZ}$, $T_{ZR}$. For small diameters, D≪$\lambda_l$, the fundamental mode becomes mainly longitudinal ($\sim u_z$), propagating with the Young velocity, $v_0 = \sqrt{E/\rho}$. Using 4×4 transfer matrices results in $Q_{mpDBR}^{(0)} \simeq 10^6$ for N×33 layers for the confined, mixed fundamental mode at D=$\lambda_l$, which is close to the limiting Q-factor related to pure longitudinal propagation and is also similar to the 1D DBR value relevant for D≫$\lambda_l$. For designs proposed herein, a cavity loss rate $\kappa = \Delta_c/\hbar$ Q≃2.8×10$^6$ s$^{-1}$ can be obtained, which value can be decreased by adding more layers.

At low temperatures the phonon anharmonicity losses are negligible (e.g., a rate $\Gamma_{anh} \simeq 1.4 \times 10^4$ s$^{-1}$ at 3 meV), while scattering off impurity mass fluctuations in natural silicon amounts to a rate two orders of magnitude larger, i.e., $\Gamma_{imp} \approx 7 \times 10^5$ s$^{-1}$. In isotopically purified bulk silicon (an enrichment of $^{28}$Si to 99%), the scattering rate can be reduced by an order of magnitude, and the related phonon mean free path will be on the order of $v_l/\Gamma_{imp} \approx 10$ cm. In this case, the cavity leakage dominates ($\kappa \gg \{\Gamma_{anh}, \Gamma_{imp}\}$), and the number of vacuum Rabi flops can reach as high as $n_{Rabi} = 2g(D)/(\Gamma + k) \simeq 102$ for a cavity Q-factor of $Q=10^6$, and $n_{Rabi} \simeq 77$ for a cavity Q-factor of $Q=10^5$. For $D=10\lambda_l$ and employing a similar quality factor results in a $n_{Rabi}^{(1)} \simeq 1(17)$ for the 1st (2nd) excited mode. Further, nearby modes can be well separated from the resonant mode, e.g., for the fundamental mode and $D=\lambda_l$ the next mode (in transverse direction) is $\sim 0.3\Delta_v = 0.9$ meV off. The transverse separation for $D=10\lambda_l$ (for the 1st excited mode) gives $0.009\Delta_v$, which is more than two orders of magnitude larger than the linewidth $\Gamma_0 \simeq (\Gamma + \kappa)/2$ of the two hybridized levels.

Table 1 shows that the donor:Si cavity-phoniton can enter the strong coupling regime with $2g/(\Gamma + k) \sim 10$-$100$. Experimental confirmation can be achieved by the observation of the "vacuum" Rabi splitting:

$$\Omega_0 = \left[ g^2 - \frac{(\Gamma - \kappa)^2}{4} \right]^{\frac{1}{2}}.$$

Two resolved spectral peaks can be observed if $2\Omega_0 > \Gamma_0$. The Rabi splitting can be enhanced as $\Omega_0 \simeq g\sqrt{N}$ by placing more than one donor (N>1) in the cavity (e.g., via a delta-doped layer or as otherwise described herein). This could allow for large coupling even for large diameter micropillars/1D DBR structures $$\left( \text{since } \frac{\sqrt{N}}{\sqrt{V}} \propto \frac{\sqrt{D^2}}{D} = 1 \right).$$

Further, strain or electric field (e.g., from a top gate) can be used to tune the valley transition into or out of resonance.

Experimental techniques are available to probe the Si-phoniton (e.g., at a low temperature of T~1K, and low phonon numbers are assumed). First, free-electron lasers can be used to probe the 1s-2p transitions in P:Si. Observation of the vacuum Rabi splitting is possible by measurement of the absorption spectrum of the allowed optically probed transition $1s(T_2) \to 2p_0(\sim 30$ meV) using weak optical excitation. Appropriate phonons can be introduced to the system by excited valley state emission, by piezo-actuators, or by increasing the temperature. Second, pump and probe optical techniques have been used to observe coherent phonon effects in III-V and SiGe SL heterostructures. Observing the reflected phonons from the disclosed phoniton devices can illustrate their phonon-Rabi splitting characteristics.

The cavity-phoniton can be realized in other materials and systems. In particular, the phoniton device can be compatible with high-Q phononic band-gap nano-mechanical and opto-mechanical (membrane) cavities in silicon (as discussed elsewhere herein). Quantum dots, spin transitions, color centers in diamond, and other donors (particularly Li:Si) can offer smaller resonance energies and correspondingly larger cavities (and wavelengths). In the case of [001]-strained silicon (Si), the two lowest levels in lithium (Li) possess essentially the same state structure as P:Si and approach a splitting of $\Delta_{Li} = 0.586$ meV for high strain (from zero splitting at no strain). See Table 1 for the corresponding Li:Si donor-phonon coupling for the $D=\lambda_l$ (now $\lambda_l = 63.2$ nm) reference cavity. As shown in Table 1, strong coupling can still be reached. For the DBR cavities, the Si thickness can be made 80 nm to 100 nm by lowering the Ge content in the substrate. For 2D-phononic bandgap cavities, direct numerical calculations for cavity-trapped phonons ($\omega_r/2\pi \approx 10$ GHz) in Si-nanostructures show the potential to reach $Q_{cav} \gtrsim 10^7$ in an ideal case.

TABLE 1

Rates and parameters for circuit QED and phoniton systems.

| Parameter | Symbol | Circuit-QED | P:Si/phonon | Li:Si/phonon |
|---|---|---|---|---|
| Resonance Freq. | $\omega_r/2\pi$ | 10 GHz | 730 GHz | 142 GHz |
| Vacuum Rabi Freq. | $g/\omega\pi$ | 100 MHz | 2.1 GHz | 13.8 MHz |
| Cavity Lifetime | $1/\kappa$, Q | 160 ns, $10^4$ | 0.22 µs, $10^6$ | 1.1 µs, $10^6$ |
| TLS Lifetime | $1/\Gamma$ | 2 µs | 8.2 ns | 22 µs |
| Critical Atom # | $2\Gamma\kappa/g^2$ | $<6 \times 10^{-5}$ | $<3 \times 10^{-5}$ | $<4 \times 10^{-5}$ |
| Critical Photon # | $\Gamma^2/2g^2$ | $<10^{-6}$ | $<2 \times 10^{-4}$ | $<6 \times 10^{-7}$ |
| # of Rabi flops | $2g/(\kappa + \Gamma)$ | ~100 | ~102 | ~93 |

In general, a number of conditions can be satisfied in the formation of a phoniton. First, the phonon should excite the transition between the two levels of the TLS directly via phonon coupling. Second, the excited donor state should emit into the preferred phonon mode of the cavity and not substantially into other phonon or photon modes, which would otherwise be considered a loss. A phonon cavity and associated confinement structure should isolate the single phonon mode and trap it for a sufficient time to allow interaction with the TLS. In addition, the phonon-matter coupling strength should be relatively large as compared with the leakage from the cavity, disintegration of the phonon into other modes, and phonon-phonon or phonon-impurity scattering. One, some, or all of the above noted conditions may be present in embodiments of a phoniton device.

Further details regarding the derivation of the Hamiltonian equations and conditions for forming the phoniton can be found in U.S. Provisional Application No. 61/613,793, which was filed by the instant inventors on Mar. 21, 2012 and has been expressly incorporated by reference herein in its entirety. Note that in the '793 application, the term "phononiton" has been used to refer to same phonon-matter coupling as the term "phoniton" in the present application.

In an alternative quantum mode, a phoniton device can operate in the dispersive regime where the coupling rate (g) is strongly exceeded by detuning of the TLS energy or frequency, e.g., $\Delta = \Omega_{TLS} - \Omega_{cavity} \gg g$. In the dispersive regime, the effective TLS-cavity coupling is given by the dispersive coupling ($\chi$), where $$\chi = \frac{g^2}{\Delta}.$$

In some embodiments, a quantum device can be configured to operate in a strong dispersive coupling regime. For example, a nano-membrane cavity system incorporating an acceptor as the TLS can be configured in such a manner. In the strong dispersive regime and in the "good cavity" limit, $\chi > \gamma_{TLS} \gg \kappa_{cavity}$. Thus, the phonon number states in the cavity can be probed by using two different tones. Using one of the first tones an electric microwave can be used to sweep around the resonance of the TLS so as to excite one of the dressed state transitions having a frequency of $\Omega_{TLS}+(2n+1)\chi$, where n is the phonon number. The second tone can be a constant phonon tone that probes the reflectivity of the dispersive phoniton system, thereby providing a characteristic "fine structure spectrum" around $\Omega_{TLS}$.

For a dispersive readout of a TLS (such as a qubit), one can use the strong dispersive coupling regime in the "bad cavity limit" (i.e., $\gamma_{TLS} \ll \kappa_{cavity}$) and a low phonon number regime (i.e., for n<<1) can be used. When $\chi > \kappa_{cavity}$, the phonon transmission or reflection spectrum is shifted from the cavity resonance frequency by $\pm\chi$. Thus, the qubit state is collapsed to one of the TLS eigenstates.

Figure 6:
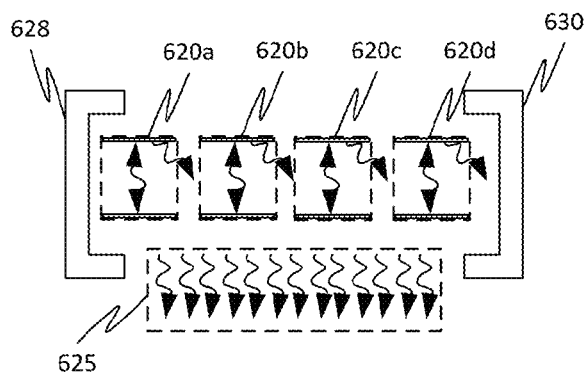
FIG. 6 is a schematic diagram of a device with multiple two-level systems within a single cavity, according to one or more embodiments of the disclosed subject matter.

The concepts presented above can be extended to other quantum device configurations to create new devices or systems that generate or use multiple phonitons. For example, multiple TLSs can be provided in a single cavity. Such a device is shown in FIGS. 6-7B and is described in more detail below. In another example, multiple phonon cavities can be constructed, each with a respective TLS, such as the device shown in FIGS. 8-10 and described in more detail below. The many individual phonitons generated among the multiple phonon cavities can be coupled together in one, two, or three dimensions, for example, by allowing tunneling through portions of the phonon confinement structures.

Referring to FIG. 6, a generalized concept for a quantum device incorporating multiple TLSs in a single cavity is shown. In particular, a plurality of TLSs 620a-620d are disposed in a cavity defined portions 628, 630 of a phonon confinement structure, which may be, for example, an acoustic reflector or other structure. Although only four TLSs are shown in FIG. 6, practical embodiments of the disclosed quantum device can include a greater number or a fewer number of TLSs in the same cavity. Moreover, although only a single cavity is shown, multiple cavities can be provided on the same device with one or more of the cavities having one or more TLSs contained therein.

In an example, each TLS may be disposed in the cavity at a location corresponding to a node or an antinode of the phonon energy trapped in the cavity. The TLSs 620a-620d may thus be arrayed along a common line or on a common plane in the cavity, although the spacing of the TLSs along the line or within the plane need not be equal (i.e., the array may be periodic, aperiodic, or substantially random). Phonon interaction with the TLSs 620a-620d in the cavity can result in the generation of multiple phonitons.

The strong coupling of the phonitons can result in interesting physical properties for the quantum device. For example, such a phoniton system can form the basis of a very low threshold phonon laser (e.g., saser) without population inversion for sound as well as other condensate-based devices. Typically, phonon lasing requires very high threshold due to the very large density of states. By placing a large number of TLSs (e.g., impurities, defects, and/or quantum dots) at the antinode (or node) of the phonon cavity and because of the strong-coupling and effective behavior of the dilute phonitons like bosons, the quantum device can form a many body state, exhibiting Bose-Einstein condensation, Mott-Insulator states, etc.

Figure 7A:
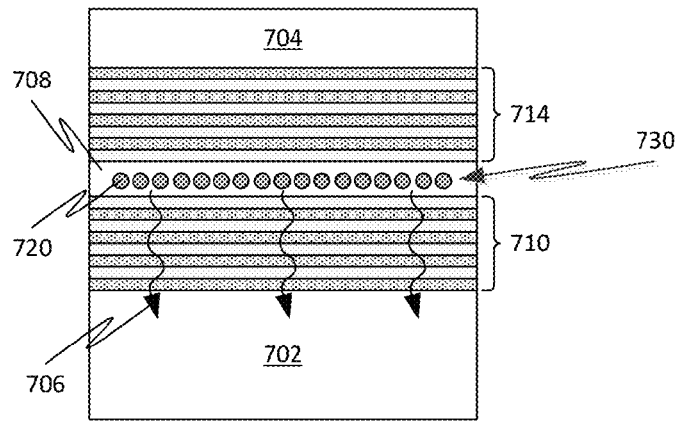
FIG. 7A is a cross-sectional view of a solid state quantum phoniton device with an array of donors in a single cavity, according to one or more embodiments of the disclosed subject matter.
Figure 7B:
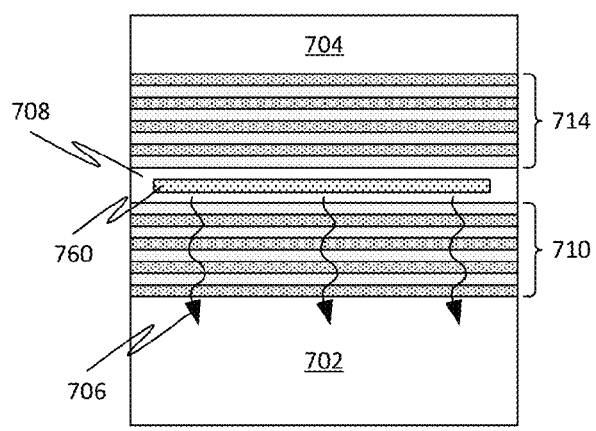
FIG. 7B is a cross-sectional view of a quantum phoniton device with a two-dimensional gas in a single cavity, according to one or more embodiments of the disclosed subject matter.

Examples of a many phoniton system are shown in FIGS. 7A-7B. In FIG. 7A, multiple TLSs 720 (e.g., an impurity such as a donor) are disposed in a one-dimensional array 730 in cavity 708. The array can be placed at the node or antinode of the phonon energy trapped in the cavity 708 by a first acoustic reflector 710 and a second acoustic reflector 714. The reflectors 710, 714 may optionally be provided between a host substrate 702 and a capping layer 704. In FIG. 7B, a two-dimensional electron gas 760, serving as a plurality of individual TLSs, is placed at the node or antinode of the phonon energy trapped in cavity 708 by reflectors 710, 714. Alternatively, the plurality of individual TLSs in FIG. 7B can be formed using a hole gas instead of the electron gas. In yet another alternative, the individual TLSs in the array can be a quantum well.

In the configurations of FIGS. 7A-7B, the quantum device can form many-body states. The first acoustic reflector 710 may be configured to allow some of the phonons 706 to leak out of cavity 708. Phonons 706 that escape the cavity 708 are coherent and highly directional, thereby providing, in effect, a phonon laser, but without the need for population inversion. Alternatively or additionally, these condensates can be used for sensing applications, for example, as with atomic Bose-Einstein condensates, such as gradiometers, etc.

In another embodiment, the TLS in a quantum device can take the form of a levitating nanosphere. Operation in the strong coupling regime, even at room temperatures, can be possible using cavities formed by such nanospheres. However, configurations of the nanosphere are not limited to a completely spherical geometry or the nano-scale size range. Rather, variations from a spherical geometry (e.g., cubic, egg-shaped, etc.) and nano-scale size ranges (e.g., micron scale, etc.) are also possible according to one or more contemplated embodiments. Optical means, such as external optical trapping via optical tweezers, can be used to levitate the spheres thereby isolating the mechanical degree of freedom thereof from the environment. Other levitation mechanisms may also be possible, such as, but not limited to, magnetic levitation. Coherent coupling of the phoniton (i.e., phonon mode+levitating nanosphere) to the outside network can be achieved using, for example, optomechanical coupling to the mechanical center-of-mass motion of the nanosphere and subsequent coupling of the center-of-mass motion to the internal mechanical cavity mode.

In an example, mechanical cavities in the form of levitating dielectric or semiconductor nanospheres can be used. The nanospheres can be formed of silicon or diamond, for example. In still another example, the nanosphere can comprise a colloidal quantum dot. The nanospheres can contain a TLS therein. The TLS can be, for example, a donor atom, an acceptor atom, a color center (e.g., nitrogen-vacancy center), and can cover a range of frequency (e.g., a few hundred GHz up to THz).

Figure 8:
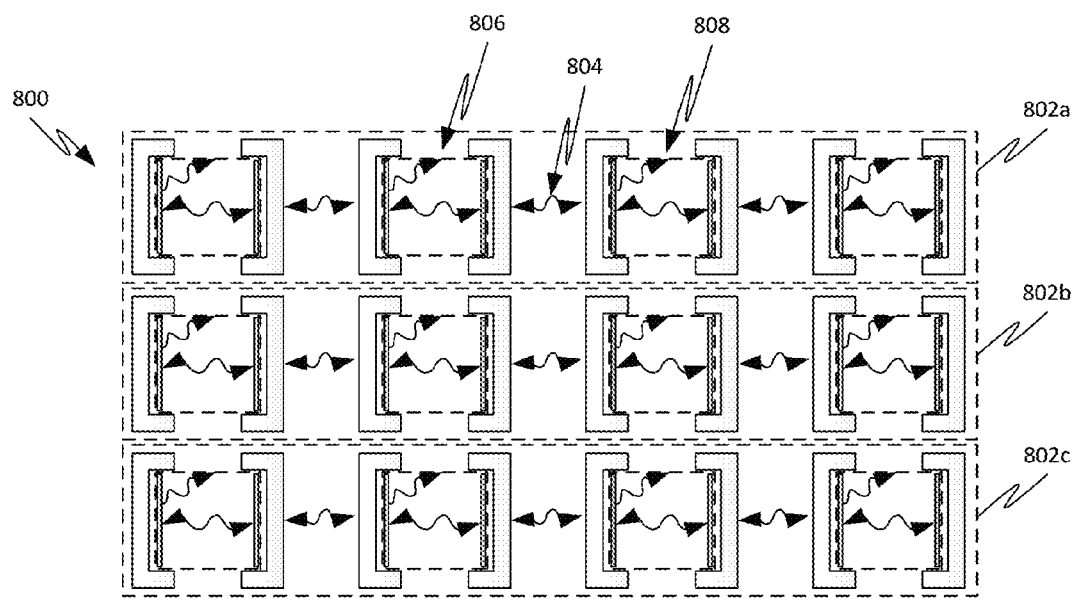
FIG. 8 is a schematic diagram showing individual phoniton cavities coupled together as an array, according to one or more embodiments of the disclosed subject matter.

Referring to FIG. 8, a generalized concept for a quantum device 800 incorporating multiple cavities with at least one TLS contained in each cavity. In particular, the cavities can be arranged in respective arrays 802a-802c (periodic or aperiodic). Although only four cavities are illustrated in each array, practical embodiments of the disclosed quantum device can include a greater number or a fewer number of cavities. Moreover, although only three arrays are shown, practical embodiments of the disclosed quantum device can include a greater number or a fewer number of arrays. Although only linear arrays 802a-802c have been illustrate, the device 800 can be constructed as multiple linear arrays, multiple two-dimensional arrays, a single two-dimensional array, multiple three-dimensional arrays, a single three-dimensional array, or otherwise. Moreover, although only a single TLS is shown in each cavity, the device 800 can be constructed such that multiple TLS are in each cavity, for example, as described above with respect to FIGS. 6-7B as well as elsewhere herein.

In an example, each TLS can be disposed in its respective cavity at a location corresponding to a node or an antinode of phonon energy trapped in the cavity. Phonon interaction with the TLS in each cavity generates a separate phoniton. One or more of the cavities can be constructed to allow at least a portion of the phonon energy to escape, so as to allow phonons to "hop" or tunnel between cavities, for example, phonon 804 travelling between adjacent cavities 806 and 808. This tunneling of phonons between cavities can result in Mott insulator states and/or condensed states of sound. Due to the very large coupling between the TLS and the phonon, high temperature (e.g., room temperature) operation is possible. Such a configuration of the quantum device 800 may find use as a sensor or massively parallel single phonon sources, as well as in other applications.

Figure 9:
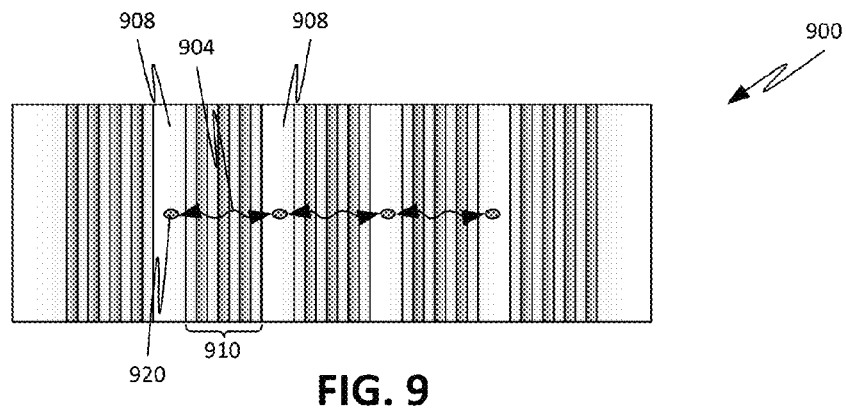
FIG. 9 is a cross-sectional view of a solid state quantum phoniton device with tunneling between cavities, according to one or more embodiments of the disclosed subject matter.
Figure 10:
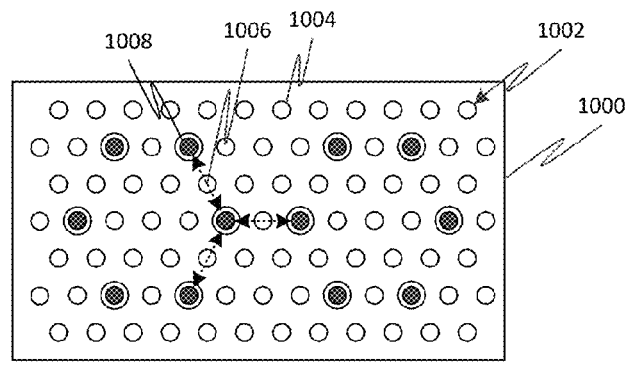
FIG. 10 is a plan view of a two-dimensional phononic crystal structure with acceptors placed at particular cavity sites for a quantum phoniton device, according to one or more embodiments of the disclosed subject matter.

Referring to FIGS. 9-10, two possible quantum device designs are shown that can be used to generate a many-body phonon state. In particular, FIG. 9 shows a quantum device 900 employing strain-matched silicon superlattice heterostructure 910 with acoustic DBR layers of, for example, $Si_xG_{1-x}/Si_yGe_{1-y}$ with a donor atom 920 in each silicon cavity region 908. The superlattice heterostructure 910 can allow phonons 904 to tunnel between adjacent cavities. The device 900 thus has multiple silicon cavity regions 908 disposed in a row and a separated by alternating layers of silicon-germanium reflectors. In such a setup, the overall reflectivity of the layers between any two adjacent silicon cavities 908 relates to a phonon inter-cavity hopping frequency, $t_{ij}$. A suitable donor atom 920 placed in each of these cavities 908 can be strongly coupled (the regime where coupling frequency is much larger than the donor relaxation and cavity loss rates as described elsewhere herein) to a specifically chosen single cavity-phonon mode ω, hence, forming a cavity-phoniton In FIG. 10, a quantum device 1000 employs a two-dimensional phonic crystal structure with acceptor atoms 1008 placed at cavity sites. Confinement structure 1002 can include an array of holes 1004 spaced across the device 1000 and may be configured to allow tunneling of phonons 1006 to reach adjacent acceptor atoms 1008. Thus, an engineered disturbance in periodicity can be used for trapping a desired phonon mode in a given region. Placement of an acceptor impurity 1008 into each of these regions can lead to cavity-phonitons with engineered inter-cavity tunneling.

To determine the parameter range for hopping and transition frequencies of quantum phase transitions, an equilibrium system where the phoniton number density is fixed can be used, which provides a good approximation when the phoniton lifetime is longer than the thermalization time. For phoniton arrays having phosphorus donors (or boron acceptors) and phonons in a silicon phononic crystal or a DBR array (for example, as shown in FIGS. 9-10), the total many-body Hamiltonian is given by the standard Jaynes-Cummings-Hubbard (JCH) model:

$$H_{JCH} = H_{JC} - \Sigma_{\langle i,j\rangle} t_{ij} a_i^\dagger a_j, \quad (3)$$

$$H_{JC} = \Sigma_i [\in \sigma_i^+ \sigma_i^- + \omega a_i^\dagger a_i + g(\sigma_i^+ a_i + \sigma_i^- a_i^\dagger)], \quad 4)$$

where $a_i(a_i^\dagger)$ is the phonon annihilation (creation) operator at a given cavity site, i, whereas $\sigma_i^+(\sigma_i^-)$ is the excitation (de-excitation) operator of the donor at that site. The inter-cavity phonon tunneling is given by the hopping frequency $t_{ij}$ for the nearest neighbor cavity sites i and j. The regular Jaynes-Cummings Hamiltonian $H_{JC}$ corresponds to the interaction of a single mode of the cavity phonon with a TLS. The fast oscillating terms (i.e., $\sigma_i^+ a_i^\dagger$) responsible for virtual transitions have been dropped via rotating wave approximation. The third term in Eq. (4) is solely responsible for effective, nonlinear on-site phonon repulsion.

The phase transition between a Mott insulator (MI) and a superfluid phase (SF) can be determined in the grand canonical ensemble where a chemical potential μ introduced as $H = H_{JCH} - \mu \Sigma_i N_i$ fixes the number density. The operator $N = \Sigma_i N_i = \Sigma_i a_i^\dagger a_i + \sigma_i^+ \sigma_i^-$ defines the total number of excitations. For simplicity, the random on-site potential with zero mean (e.g., fluctuations of the chemical potential), δμ$_i$, can be assumed to vanish, and $t_{ij}$ can be assumed to be a uniform short-range hopping. The boundary between the MI and the SF phases (Mott lobes) can be determined by the value of μ for which adding or removing a particle does not require any energy. Introducing the SF order parameter, ψ=⟨$a_i$⟩ via mean-field theory and applying the decoupling approximation, i.e., $a_i^\dagger a_j = \langle a_i^\dagger\rangle a_j + a_i^\dagger \langle a_j\rangle - \langle a_i^\dagger\rangle\langle a_j\rangle$, yields the mean-field Hamiltonian:

$$H_{MF} = H_{JC} - \Sigma_i \{zt\psi(a_i^\dagger + a_i) + zt|\psi|^2 - \mu N_i\}. \quad (5)$$

The correlation number z is the number of nearest neighbors in a given array geometry.

Figure 14A:
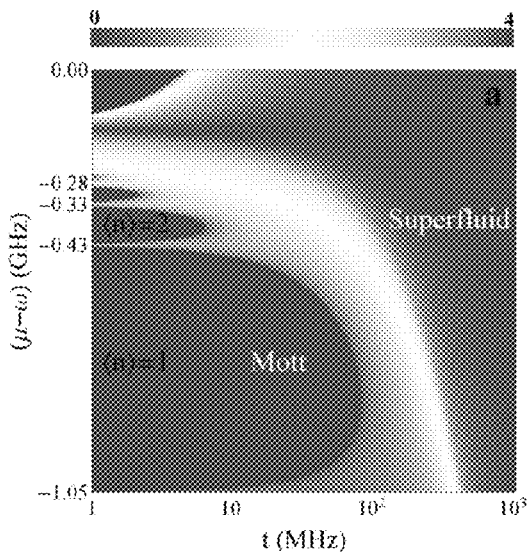
FIG. 14A is a graph of the superfluid phase (SF) order parameter for a many-body phonon-qubit system involving P:Si donors, according to one or more embodiments of the disclosed subject matter.
Figure 14B:
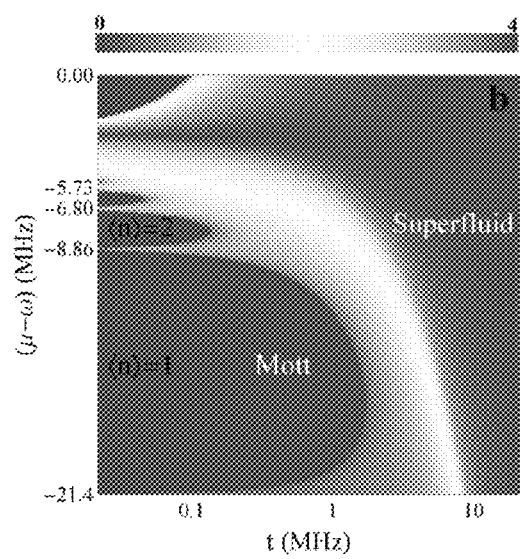
FIG. 14B is a graph of the SF order parameter of a manybody phonon qubit system involving B:Si acceptors, according to one or more embodiments of the disclosed subject matter.

Minimization of the ground state energy E of the mean-field Hamiltonian for different parameter ranges of μ, Ω, t for phosphorus (donor) and boron (acceptor) in silicon yields the Mott lobes illustrated in FIGS. 14A-14B. In particular, FIG. 14A relates to a many-body phonon qubit system involving P:Si donors while FIG. 14B relates to a many-body phonon qubit system involving B:Si acceptors. The SF order parameter, ψ, is shown as a function of the phonon hopping frequency t and chemical potential pt with cavity frequency of ω. MI lobes correspond to the regions of ψ=0 where the number of phonons in each lobe is constant (⟨n⟩=0, 1, 2, ... ). The SF phase corresponds to ψ≠0.

For the calculation of Mott lobes, in the case of a phosphorus donor impurity, an acoustic DBR design with correlation number z=2 can be used, for example, for the configuration shown in FIG. 9. The donor valley states $1s(A_1)$ and $1s(T_2)$ make up the TLS with a transition frequency of ∈=0.7 THz, which corresponds to a wavelength of approximately 12 nm. Due to this small wavelength, DBR heterostructures capable of small cavity lengths can be more suitable device structures for maximal coupling. A large array of silicon/DBR heterostructure phonon cavities can be designed to support a fundamental longitudinal acoustic (LA) phonon mode in resonance with the donor transition (ω=∈).

In the case of the boron acceptor impurity, the transverse acoustic (TA) phonon modes of the cavities can yield maximum coupling. TA phonon cavity mode of ω=14 GHz (λ=390 nm) can be in resonance with the spin splitting (in the presence of a uniform magnetic field of B=1 T) of the boron valence band acting as a TLS. However, at this large wavelength, DBR phonon cavities may be more difficult to construct due to the critical thickness constraints. As a result, 2D phononic crystal designs, such as that shown in FIG. 10, may be used to implement the quantum device.

Figure 15:
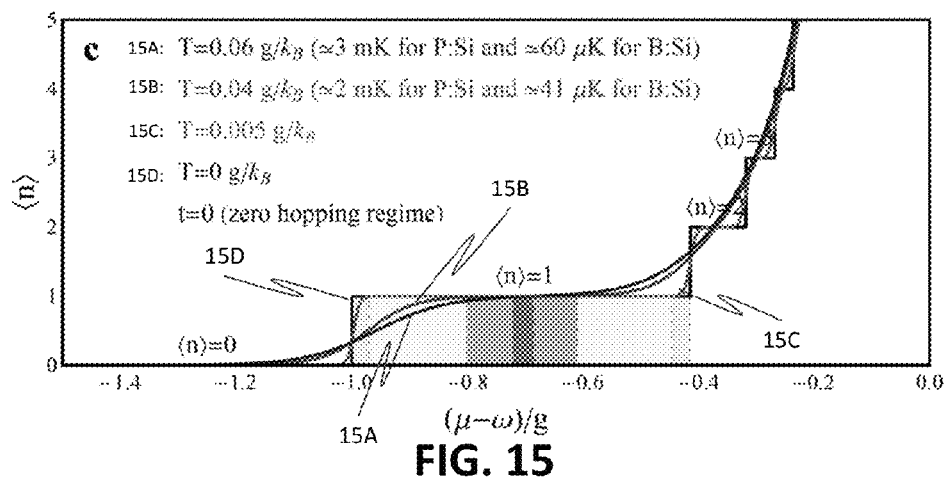
FIG. 15 is a graph of average phonon number per site for various temperatures at zero hopping in a device, according to one or more embodiments of the disclosed subject matter.

Using a quality factor of Q=$10^5$, the average phonon number ⟨n⟩ per site versus μ for various temperatures can be calculated. FIG. 15 shows the average phonon number per site various temperatures at zero hopping. In the figure, plateaus of constant ⟨n⟩ correspond to MI states. The stable MI states $$\left(\text{compressibility}, \frac{\partial \langle n\rangle}{\partial \mu} = 0\right)$$

quickly shrink with increased temperatures. The maximum temperature allowed to access the first MI state is given as T=0.04-0.06 g/$k_B$ in terms of coupling strength.

The MI and the SF states exhibit different coherence characteristics which can be accessed via coherence (correlation)

function measurements in setups similar to modified homodyne/heterodyne or Hanbury-Brown-Twiss. Each of these techniques generally requires single phonon detectors. However, even with single phonon detectors unavailable, another useful tool, a so called phonon-to-photon translator (PPT), can be used to coherently convert phonons to photons, therefore allowing optical detection techniques to be applied on the cavity phonon-TLS system.

The many-phoniton system can be driven at each site by a phonon field of amplitude $\Omega_i$ and frequency $\omega_d$. Switching to the rotating frame of the driven field yields the time-independent Hamiltonian given by:

$$H_S = \Sigma_i [\Delta \in \sigma_i^+ \sigma_i^- + \Delta \omega a_i^\dagger a_i + g(\sigma_i^+ a_i + \sigma_i^- a_i^\dagger)] - \Sigma \langle_{i,j}\rangle t_{i,j} (a_i^\dagger a_j + a_i a_j^\dagger) + \Sigma_i \Omega_i (a_i^\dagger + a_i) = H_S^0 + H_S^d, \quad (6)$$

where $\Delta\in = \in - \omega_d$ ($\Delta\omega = \omega - \omega_d$) is the detuning between the driving field and the TLS (cavity). The driving field Hamiltonian is separated as $H_s^d$. In the case of dissipation defined by the cavity loss rate ($\kappa$) and the qubit relaxation rate ($\Gamma$), the master equation for the density matrix is given by:

$$\dot{\rho} = -i[H_S, \rho] + \kappa \Sigma_i L[a_i]\rho + \Gamma \Sigma_i L[\sigma_i^-]\rho, \quad (7)$$

where the Lindblad super operator is defined as $L[\hat{O}]\rho = \hat{O}\rho\hat{O}^\dagger - \{\hat{O}^\dagger \hat{O}, \rho\}2$. The number of elements of the density matrix $\rho_{i,j}$ to be determined from Eq. (6) can be given by $(2(\Lambda+1))^{2n_c}$ where $n_c$ is the number of cavities with a single donor/acceptor inside.

Figure 17A:
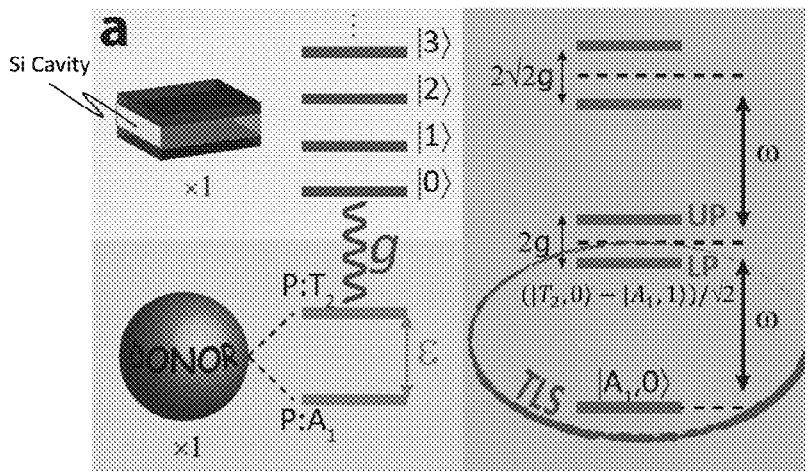
FIGS. 17A-17C illustrate energy schematics of a single cavity phonon-donor, a pair of coupled cavity phonon-donors, and an infinite array of coupled cavity phonon-donors, respectively, according to embodiments of the disclosed subject matter.
Figure 18:
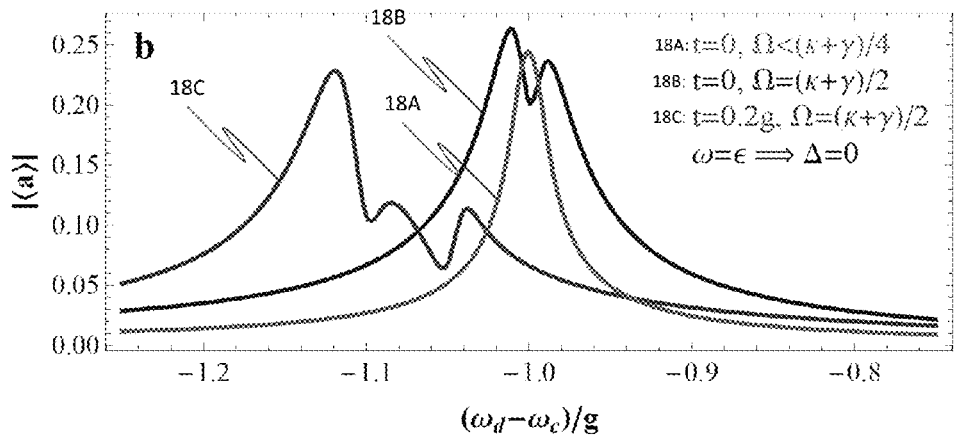
FIG. 18 is a graph showing transmission amplitude versus detuning for two coupled cavities, according to one or more embodiments of the disclosed subject matter.

A single phoniton system (e.g., as shown in FIG. 17A) can be examined under different driving fields and hopping conditions, for example, by driving and measuring the heterodyne amplitude of a single site in the case of zero hopping (i.e., $t=0$) and resonance (i.e., $\in = \omega$). As suggested by line 18A in FIG. 18, for weak driving field strengths smaller than a critical value $\Omega < \Omega_c = (\kappa + \Gamma)/4$, the system initially lies in the linear response regime and exhibits a Lorentzian response to the driving field frequency. The critical coherent drive strength is estimated as $\Omega_c^P \sim 42$ MHz and $\Omega_c^B \sim 2$ MHz for a phoniton composed of a phosphorous donor and a boron acceptor, respectively.

With increasing field strengths, this response breaks down and a super-splitting of the phonon field amplitude can occur. Such behavior can be understood as a coupling of the driving field only with the antisymmetric $1^{st}$ dressed state $((|0, e\rangle - |1, g\rangle)/\sqrt{2})$ and the ground state $|0, g\rangle$, therefore forming a TLS. TLS treatment will stay valid with the driving field strength as long as the non-linearity of the Jaynes-Cummings Hamiltonian will only allow single phonon excitations, preventing access to the higher multiple excitation manifolds and thus causing a phonon blockade.

In the single cavity system (e.g., FIG. 17A), the lowest two single excitation energies are given by $\in_2 = 2\omega - g\sqrt{2}$ and $\in_1 = \omega - g$, respectively. This yields to the condition $\Omega_i << g(2-\sqrt{2})$ ($\Omega_i << \in_2 - 2\in_1$) of single excitation only subspaces of the system, also known as the "dressing of the dressed states." As the single phoniton system still exhibits super-splitting ($\Omega = (\kappa + \Gamma)/2$), turning on the hopping parameter ($t=0.2$ g) makes the two phoniton states (one phoniton in each cavity) available to occupation. This results with a clear shift in eigen frequencies and an appearance of a third peak at the heterodyne amplitude spectrum.

Figure 17B:
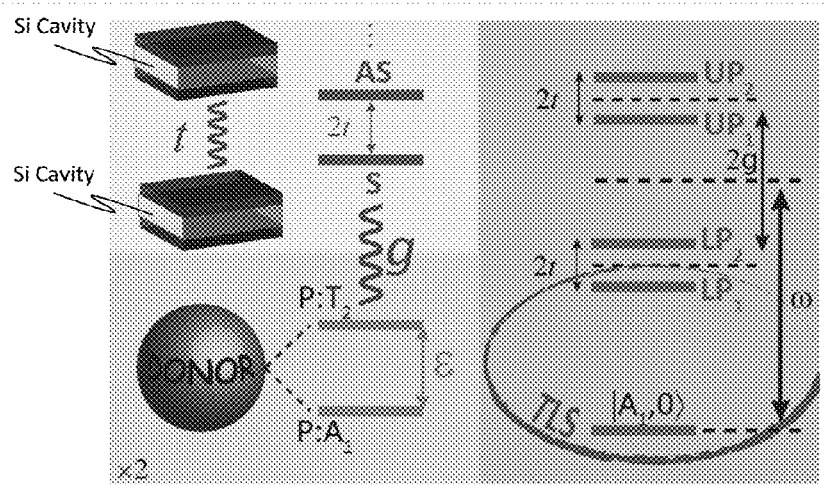
Figure 19:
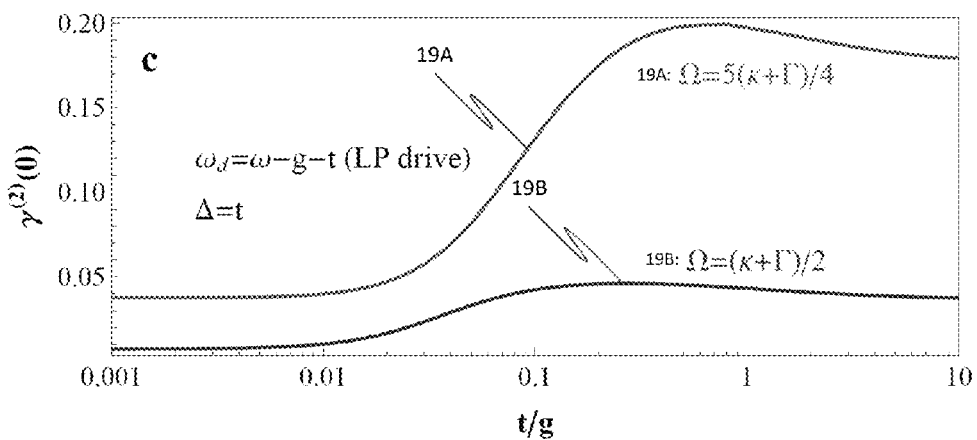
FIG. 19 is a graph showing the second order coherence versus hopping frequency for different drive strengths for a pair of coupled cavities, according to one or more embodiments of the disclosed subject matter.

The second order coherence function can be given by $\gamma^{(2)}(0) = \langle a^\dagger a^\dagger aa\rangle/\langle a^\dagger a\rangle^2 = (\langle(\Delta n)^2\rangle - \langle n\rangle)/\langle n\rangle^2 + 1$, where the variance is $\Delta n = n - \langle n\rangle$. MI phase can be identified by $\gamma^{(2)}$ $$(0) = 1 - \frac{1}{\langle n\rangle} < 1,$$

whereas SF phase is given by $\gamma^{(2)}(0) = 1$. For a two-coupled phoniton case (e.g., as shown in FIG. 17B), the second-order coherence function $\gamma^{(2)}$ can be calculated versus the hopping frequency for different field strengths. Throughout all hopping frequencies, qubits can be kept detuned from their encapsulating cavity mode by $\Delta = \omega - \in = t$, for example, to ensure a resonance with the antisymmetric mode (lowest) of the overall coupled cavity mode. At this detuning choice, the eigen energy difference between the ground state (GS) and the lower phoniton (LP) branch can be given by $\Delta E = \omega - g - t$. The driving field can be kept in resonance with this energy difference $\omega_d = \Delta E$ to simulate a TLS system. However, for resonant driving purposes, this detuning is not necessary, as long as the energy difference between GS and LP can be determined each time hopping and/or coupling parameters are changed. Even in the case of a strong driving field, $\Omega >> \Omega_c$, the two phoniton system exhibits a phonon anti-bunching. FIG. 19 shows the second-order coherence function $\gamma^{(2)}$ versus the hopping frequency for drive strengths of $\Omega = 2\Omega_c$ and $\Omega = 5\Omega_c$, both in resonance with the LP branch (i.e., $\Omega_d = \omega - g - t$). Donors can be detuned by the hopping bandwidth $\Delta = t$ and in resonance with the anti-symmetric cavity-phonon mode.

For large cavity arrays, the mean-field theory and density matrix master equation can be applied together for weak coherent drive and strong coupling regime. Starting from the Hamiltonian in Eq. (6), application of the mean field $\psi = \langle a\rangle$ and decoupling approximation results in:

$$H'_{MF} = \Sigma_i [\Delta \in \sigma_i^+ \sigma_i^- + \Delta \omega a_i^\dagger a_i + g(\sigma_i^+ a_i + \sigma_i^- a_i^\dagger) - zt(a_i^\dagger \psi + a_i \psi^* - \psi^2) + \Omega_i(a_i^\dagger + a_i)], \quad (8)$$

in the presence of a coherent driving field. Including the cavity loss and qubit relaxation, the master equation is essentially the same as Eq. (4) but with only the driven system Hamiltonian $H_S$ being replaced by the mean-field Hamiltonian $H_{MF}$. The SF order parameter $\psi$ is evaluated by the self-consistency check $\psi = \text{Tr}(\rho a)$. For phonitons composed of P donors, the second-order coherence function $\gamma^{(2)}$ versus the hopping frequency for two different field strengths can be calculated, e.g., $\Omega << \Omega_c$ and $\Omega = 2\Omega_c = 84$ MHz. For this particular donor choice, the critical drive strength can be much smaller than the coupling strength $$\left(\text{i.e., } \frac{\Omega_c}{g} \sim 0.006\right)$$

due to already small amounts of donor relaxation and cavity loss. For a boron B acceptor, the ratio can be estimated as $$\frac{\Omega_c}{g} \sim 0.094.$$

Figure 17C:
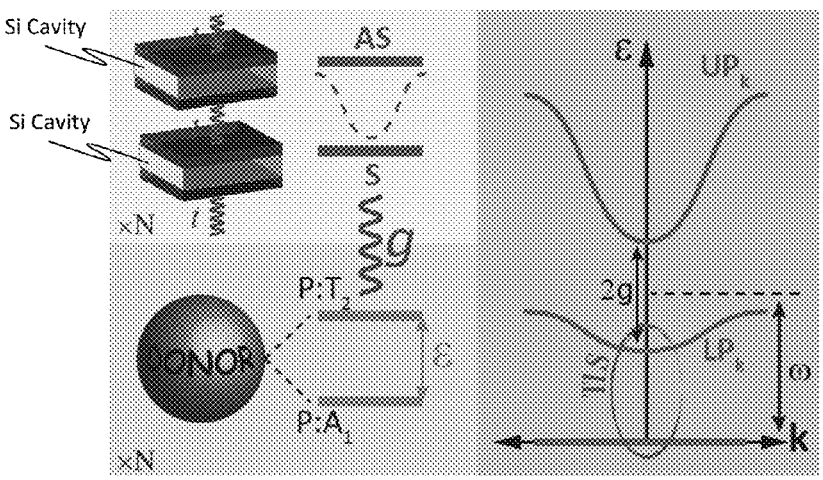
Figure 20:
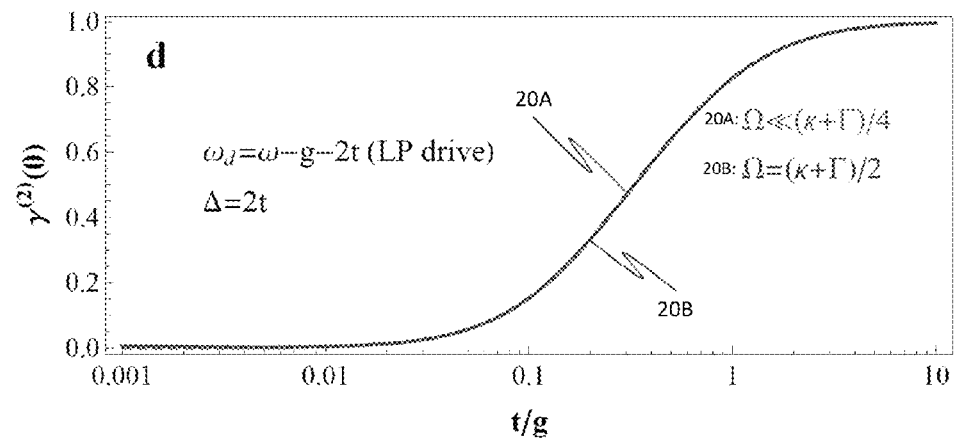
FIG. 20 is a graph showing the second order coherence versus hopping frequency for different drive strengths for an infinite array of coupled cavities, according to one or more embodiments of the disclosed subject matter.

An infinite phoniton array (e.g., as shown in FIG. 17C) can exhibit a smooth transition from incoherent to coherent case, thus indicating a phase transition from MI to SF state by increasing the hopping frequency. FIG. 20 shows the second-order coherence function $\gamma^{(2)}$ versus the hopping frequency for an infinite array. The drive strengths of $\Omega << \Omega_c$ and $\Omega = 2_c$ are shown. Donors can be detuned by the hopping bandwidth $\Delta = 2t$. While FIG. 19 shows that the two coupled phoniton arrangement stays anti-bunched, employing an infinite array (or at least a sufficiently large number) of coupled phonitons, the many-body effects can become dominant with little effect in behavior due to changes in the driving field.

Figure 21:
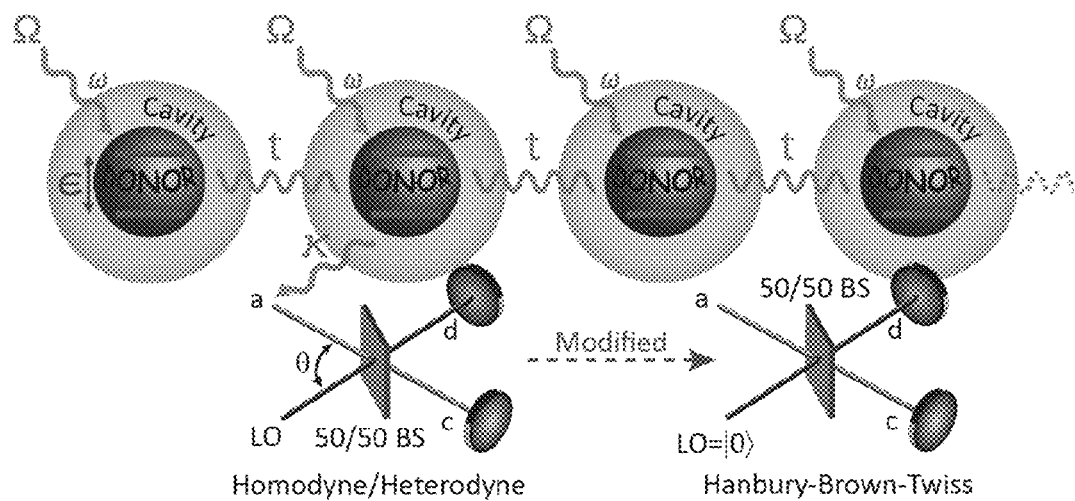
FIG. 21 is a diagram illustrating a read-out scheme from a single site by using a homodyne/heterodyne or modified Hanbury-Brown-Twiss setup, according to one or more embodiments of the disclosed subject matter.

In such coupled phoniton systems, external phononic or microwave fields can be used to drive the phoniton system, for example to provide read-out of the system as shown in FIG. 21. Alternatively or additionally, the external driving field can compensate for losses, provide for read/write schemes (for example, when using the phoniton as a memory device), allow measurements of the phoniton system, and/or manipulate rigid low temperature requirements. Practical embodiments incorporating phoniton arrays may thus use a driving field external to the phoniton array (e.g., generated on-device, such as on-chip, or off-device) and conveyed to the array (e.g., by a phonon waveguide or via tunneling) to achieve one or more of the above noted purposes.

TABLE 2

Parameters for phoniton system using a phosphorus donor or a boron acceptor in silicon.

| Parameter | Symbol | P:Si | B:Si |
| --- | --- | --- | --- |
| Resonance Freq. | $\omega_r/2\pi$ | 730 GHz | 14 GHz |
| Coupling Strength | $g/2\pi$ | 1 GHz | 21.4 MHz |
| Wavelength | $\lambda$ | ~12 nm | ~390 nm |
| Cavity Lifetime | $1/\kappa$, Q | 22 ns | 1.14 µs |
| TLS Lifetime | $1/\Gamma$ | 8.2 ns | 0.14 µs |
| # of Rabi flops | $2g/(\kappa + \Gamma)$ | ~102 | ~34 |

The observation of QPTs in large arrays may require extremely low effective temperatures. For P:Si, T=2-3 mK (for g=1 GHz) and for B:Si, T=40-60 µK (for g=21 MHz). Active cooling can be used in such quantum devices. Moreover, the proposed many-body phoniton systems can be used as quantum simulators or mediators between different quantum components and potentially for new quantum devices.

Figure 11:
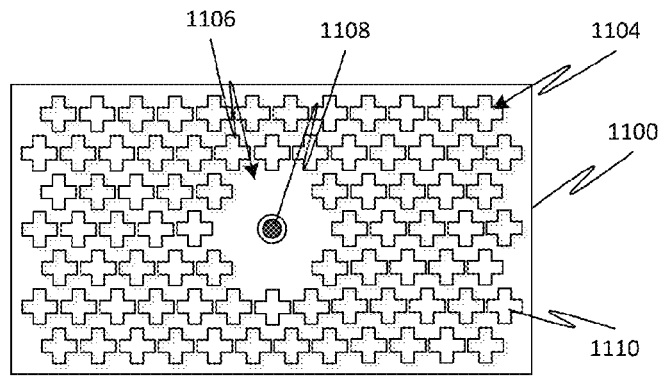
FIG. 11 is a plan view of a nanomechanical two-dimensional phonon bandgap cavity for a quantum phoniton device, according to one or more embodiments of the disclosed subject matter.
Figure 12:
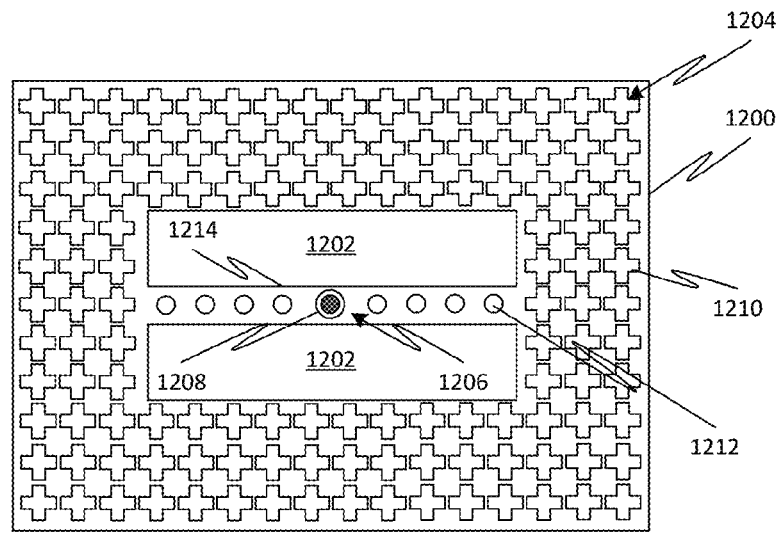
FIG. 12 is a plan view of a nanomechanical one-dimensional phonon bandgap cavity for a quantum phoniton device, according to one or more embodiments of the disclosed subject matter.

Referring to FIGS. 11-12, a quantum circuit element based on a single acceptor (such as B, Al, In, etc.) embedded in a patterned silicon nano-membrane is shown. Such a nano-membrane can be compatible with optomechanical components. The acceptor qubit shown in FIGS. 11-13 can be tunable in a range of 1-50 GHz by an external magnetic field, an additional electric field, or an additional strain. The regime of strong resonant and also strong dispersive coupling of the qubit to a confined acoustic phonon is also possible.

FIG. 11 illustrates a nanomechanical 2D phoniton device 1100. An acceptor 1108 can be disposed in a cavity region 1106 surrounded by a phonon confinement structure 1104 including an array of holes 1110 surrounding the cavity region 1106. FIG. 12 illustrates a nanomechanical 1D phoniton device 1200. An acceptor 1208 can be provided at a cavity region 1206 in a beam 1214. A phonon confinement structure 1204 can include an array of holes 1210 surrounding an outer region, a pair of recesses separating the beam 1214 from the outer region, and an array of holes 1212 in beam 1214. An on-chip phonon waveguide (not shown) can allow phonon coupling in/out of the system.

Figure 13:
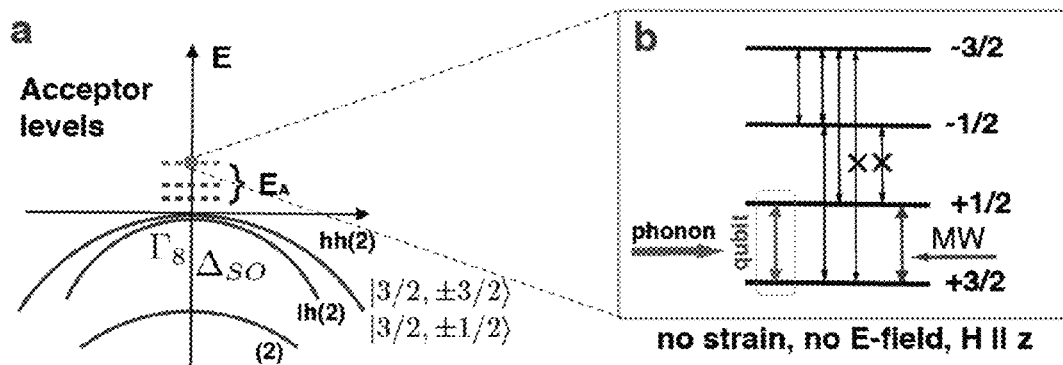
FIG. 13 shows the hole valence bands in silicon (left side, (a)) and level splitting in the presence of a magnetic field (right side, (b)), according to one or more embodiments of the disclosed subject matter.
Figure 22:
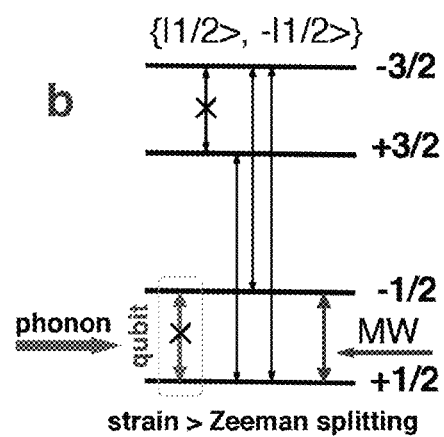
FIG. 22 shows level splitting in the presence of a magnetic field and stress along the 2 direction in the case of $\delta E_E > \delta E_H$, according to one or more embodiments of the disclosed subject matter.

FIG. 13($a$) shows the hole valence bands in silicon. There is a four-fold degeneracy at the band top (and of lowest acceptor states) corresponds to particles of spin J=3/2 ($\Gamma_8$ representation of cubic symmetry). Application of an external magnetic field along [0,0,1] direction results ground state splitting as shown in FIG. 13($b$) Level rearrangement can be attained via additional strain, as shown in FIG. 22. System manipulation via electric static/microwave fields is also possible.

Two acceptor qubit arrangements are possible based on the lifting of the 4-fold ground state degeneracy via external fields. For a magnetic field $H_z=(0,0,H_z)$ along the crystal [0,0,1] growth direction one can choose the lowest two Zeeman levels, $|\phi_1\rangle=|3/2\rangle$, $|\phi_2\rangle=|1/2\rangle$, as the qubit. The Zeeman type interaction is given by: $H_H=\mu_B\{g'_1 JH+g'_2(J_x^3 H_x+c.p.)\}$, where c.p. is the cyclic permutation of x, y, z; $J_x, \ldots$, etc. are the spin 3/2 matrices (in the crystal directions), and the renormalized g-values $g'_1, g'_2$ ($\mu_B$ is Bohr magneton), depending on the acceptor bound states, fulfill the relations $|g'_1|\approx 1$, $|g'_2|\ll|g'_1|$. The qubit energy splitting $\delta E_h\approx\mu_0 g'_1 H$ is tunable in the range≈1-40 GHz for H=0.1-3T. The qubic term in $H_H$ lifts the level equidistancy. The lowest and highest splitting (see FIG. 13) are larger than the middle splitting by $$\frac{3g'_2}{g'_1} \simeq 0.09.$$

For a magnetic field H tilted away from the crystal axis [0,0,1], the qubit splitting is weakly angle dependent.

Alternatively, a second qubit arrangement is possible with mechanical stress in addition to the magnetic field. Mechanical stress lifts the ground state degeneracy only partially, e.g., for stress along the crystal growth $\hat{z}$-direction, states $|\pm 3/2\rangle$ and $|\pm 1/2\rangle$ remain degenerate. Providing the stress causes an energy splitting larger than the splitting due to magnetic field $H_z$, the level configuration in FIG. 13($b$) rearranges so that the lowest (qubit) levels will be $|\phi'_1\rangle=|-1/2\rangle, =|1/2\rangle$, as shown in FIG. 22. This forms an alternate qubit, decoupled from phonons to first order; however, coupling can be switched on via electric field, as described further below. The effect of strain is described by the Bir-Pikus Hamiltonian:

$$H_\varepsilon = a'Tr\varepsilon_{\alpha\beta} + b'\varepsilon_{xx}J_x^2 + \frac{d'}{\sqrt{3}}\varepsilon_{xy}\{J_x J_y\}_+ + c.p. \tag{9}$$

The renormalized deformation potential constants a', b', d' for acceptor B:Si can be estimated in the effective mass approximation (EMA), or extracted from experiment. The latter gives b'=−1.42±0.05 eV, d'=−3.7±0.4 eV. Using $H_\varepsilon$, a splitting of $\delta E_E\approx 1$-10 GHz results for external stress in the range of $10^5$-$10^6$ Pa. Such stress can be created in tensioned nanomechanical structures/membranes, improving also the mechanical Q-factor. A much larger stress ($\gtrsim 10^7$ Pa) is possible due to a nearby (random) crystal defect or for [0,0,1] strain due to a SiGe substrate. The resulting splitting in the few hundred GHz range effectively suppresses the qubit-phonon coupling.

In order to calculate the qubit-phonon coupling, a quantized phonon field can be considered in addition to any classical field. The coupling of the qubit $\{1=|3/2\rangle, 2=|1/2\rangle\}$, is calculated to a plane wave mode $\in_{vac}\xi_q^{(o)}e^{-ig\cdot r}$ with polarization $\xi_q^{(o)}$ and energy $\hbar v_o q$ that proved to be a good estimation of coupling to modes with realistic boundary conditions. The relevant matrix element is proportional to the "phonon vacuum field" strain $$\varepsilon_{vac} \equiv \left(\frac{\hbar}{2\rho V v_0 q}\right)^{1/2},$$

where ρ is the mass density, $v_o$ is the sound velocity, and V is the mode volume. For longwave acoustic phonons, (when the acceptor is placed at maximum strain of the nanomechanical cavity) the coupling can be given by:

$$g_\sigma^{3/2,1/2} = d'\left(\frac{\hbar\omega_s q_s}{8\rho\hbar^2 V v_\sigma^2}\right)^{1/2}\begin{Bmatrix}\cos\theta, \sigma = t_1 \\ i\cos 2\theta, \sigma = t_2 \\ -i\sin 2\theta, \sigma = l\end{Bmatrix}e^{-i\varphi}, \quad (10)$$

where the polar angles of the wave vector q are with respect to $\hat{z}$-direction. Thus, the mode $t_2$ has a maximum along the phonon cavity ($\theta \approx \pi/2$). An alternative is to have an in-plane magnetic field $H_x$ along the crystal [1,0,0] $\hat{x}$-direction (the latter is chosen to be along the phonon cavity). Both modes $t_1$, $t_2$ (now at $\theta \approx 0$) can be coupled to the cavity. The maximal coupling $g_{max,\sigma}^{3/2,1/2}$ scales as $\sqrt{\omega_s q_s/V} \propto \sqrt{q/V}$, as expected for a $(1\rightarrow 1s)$ transition. Taking a cavity $V \simeq d\lambda^2$ (d=200 nm being an exemplary thickness for the Si membrane) results in a coupling in the range $g/2\pi \simeq 0.4$-21 MHz for the frequencies of 1-14 GHz. See Table 3 below. The other allowed transition $|3/2\rangle \rightarrow |-1/2\rangle$ (at twice the qubit frequency) is well detuned, while the transitions $|3/2\rangle \rightarrow |-3/2\rangle, |1/2\rangle \rightarrow |-1/2\rangle$ are phonon forbidden.

When the in-plane magnetic field has some angle $\theta_0$ with the cavity (crystal x-axis), all transitions are allowed. Also, the qubit coupling to a confined cavity phonon will change. As a qualitative example, for a plane wave transverse mode $t_1$ (or $t_2$) along the x-axis ($\theta \approx 0$), the coupling will change in the same way as in Eq. (10), with $\theta$ replaced by $\theta_0$. This allows manipulation of the qubit-cavity coupling by rotation of the magnetic field.

For the qubit $\{1=|3/2\rangle, 2=|1/2\rangle\}$, the relaxation in the cavity is bounded by the bulk phonon emission rate, i.e., $\Gamma_{relax} \lesssim \Gamma$, and is given by:

$$\Gamma_{12}(\theta_0) = \frac{E_{12}^3}{20\pi\rho\hbar^4} \quad (11)$$
$$\{d'^2(\cos^2 2\theta_0 + 1)[2/3v_l^5 + 1/v_t^5] + b'^2\sin^2 2\theta_0[2/v_l^5 + 3/v_t^5]\}$$

Here the contribution of longitudinal phonons is only a few percent and results in Table 3 are for $\theta=0$. Note that the coupling in this case can be switched off (e.g., for a $t_1$-mode along $\hat{x}$-direction, at $\theta=\pi/2$) while the relaxation cannot.

For the alternate qubit, $\{|-1/2\rangle, |1/2\rangle\}$, the stress and magnetic field are parallel along the growth $\hat{z}$-direction. In this scenario, both coupling and relaxation are zero in the absence of an electric field and can be switched on using non-zero electric field $E_z$ in the same direction. The qubit-phonon coupling can be given by Eq. (10) multiplied by a coupling factor, which is a function of the splitting ratios given by $$r_h \equiv \frac{\delta E_H}{\delta E_\varepsilon}, r_e h \equiv \frac{\delta E_E}{\delta E_\varepsilon} : f(r_h, r_e) = (\sqrt{z_+ z_-} - 1)/\sqrt{(1+z_+)(1+z_-)},$$

with $z_\pm = \left(1 \pm \sqrt{(1 \mp r_h)^2 + r_e^2} \mp r_h\right)^2/r_e^2$.

Thus, for example, for $r_h=0.5$-0.9, this factor reaches $\approx 0.25$-0.65 for some optimal value of the electric field splitting, $r_e \lesssim 1$, which allows strong qubit-cavity coupling.

The relaxation times shown in Table 3 are comparable to $T_1$, $T_2$ measurements in bulk Si at low B:Si doping (e.g., $8 \times 10^{12}$ cm$^3$ or 500 nm acceptor spacing), where $T_{1,exp} \simeq 7.4$ µs and $T^*_{2,exp} \simeq 2.6$ µs. While bulk $T^*_2$ is limited by electric-dipole inter-acceptor coupling, both $T_1$, $T_2$ may be improved by the use of substantially defect-free samples, isotopically purified Si, and single acceptors. $T_1$ may also be improved in nanomembranes (d<<$\lambda$) due to phase-space suppression. Finally, the relaxation to photons is strongly suppressed since $(v_s/c)^3 \approx 10^{-15}$.

In the 1D/2D-phononic bandgap Si nanomembranes illustrated in FIGS. 11-12, the main cavity loss mechanism is due to (fabrication) symmetry-breaking effects, coupling the cavity mode to unconfined modes, and also due to cavity surface defects. Bulk loss mechanisms may be considered negligible in the GHz frequency range. The cavity Q-factor for frequencies of 1 GHz up to tens of GHz can be engineered in the range of $10^4$-$10^5$, or higher.

Table 3 below shows calculations for various quantum devices. As Table 3 illustrates, resonant coupling is possible for $g_{12} \gg \Gamma_{12}$, K in a wide frequency range, thereby allowing a number of Rabi flops, e.g., ~30-100. A frequency of 1 GHz is the limit for T$\simeq$20 mK, but active cavity cooling can be used to alter the limit. Different energy scaling of the coupling and qubit relaxation can set a maximal energy splitting of $$E_{12}^{max} = \frac{5}{4d'}\sqrt{\frac{\rho\hbar^3 v_t^5}{\pi}} \approx 200 \text{ GHz}.$$

At such high frequencies the limiting factor would be the significant deterioration of the cavity Q-factor. Yet, for example, at 14 GHz even a Q=$10^3$ can still lead to strong coupling.

Embodiments of the disclosed phoniton devices and systems can allow for on-chip manipulation of coherent acoustic phonons via coupling to acceptor qubit states in a nanomechanical cavity. Hybridization of the phonon-acceptor system and strong dispersive coupling are both possible with parameters comparable to circuit QED and far surpassing semiconductor quantum dot QED. The phoniton component can be incorporated in more complex systems, for example, with phonon-photon interfaces to photonics and in arrays of other phoniton systems for engineered many-body phonon devices. From the perspective of qubits, the isolated acceptor provides a potentially robust two-level system for quantum information processing. The phoniton components described herein offer an avenue for phonon dispersive readout of acceptor qubit states and the potential for spin qubit-to-photon conversion in silicon.

The role of an atom can be taken by a single impurity in a host crystal, e.g., in silicon. The impurity-acoustic phonon interaction $H_{e,ph}^{ac}(r) = \Sigma_{ij}\hat{D}_{ij}\hat{\varepsilon}_{ij}(r)$ may lead to the strong coupling regime even for cavity effective volume of few tens of $\sim\lambda^3$, since the deformation potential matrix elements are large: $\langle\psi_s|\hat{D}_{ij}|\psi_s\rangle \sim$ eV. Qualitatively, the large coupling can be traced from the much smaller bandgap (~eV) in the "Si-vacuum" as compared to QED (~$10^6$ eV).

With respect to silicon, the 4-fold degeneracy (as shown in FIG. 13) at the top of the valence band (neglecting heavy-light hole splitting) corresponds to propagation of particles of spin J=3/2, reflecting the $\Gamma_8$ representation of cubic symmetry. Relatively large spin-orbit coupling implies a 2-fold degenerate band ($\Gamma_7$ representation), split-off by an energy gap $\Delta_{SO} \simeq 45$ meV. For shallow acceptor centers in silicon (e.g., B, Al, In, etc.) the ionization energy, $E_A \sim \Delta_{SO}$, so that all valence bands can play a role in the acceptor states. Still, the lowest acceptor states remain 4-fold degenerate since the acceptor spherical (Coulomb) potential does not change the cubic symmetry of the host crystal.

The degeneracy of the ground state can be lifted by external magnetic field via the Zeeman type interaction $H_H$ (as shown in FIG. 13), and/or via mechanical strain (as shown in FIG. 22). The related Hamiltonians are invariants of the cubic symmetry group $O_h = T_d \times I$ and time reversal and are constructed from the momentum operator, $$k_\alpha = \frac{1}{i}\frac{\partial}{\partial x_\alpha} + \frac{e}{c}A_\alpha$$

(or the corresponding fields) and the spin-3/2 operators $J_\alpha$, $\alpha=x, y, z$.

For a relatively weak electric field, E, the linear Stark effect is possible:

$$H_E = \frac{p_E}{\sqrt{3}}(E_x\{J_yJ_z\}_+ + E_y\{J_zJ_x\}_+ + E_z\{J_xJ_y\}_+), \quad (12)$$

since an ion impurity actually reduces the cubic symmetry ($T_d \times I$) to $T_d$, and thus, there is no invariance under inversion. The ground state splits to two doubly degenerate levels; however, the $H_E$ does not commute with $J_z$ for any direction of the field E, leading to mixing of the Zeeman states. The latter can be useful to switch on/off the phonon coupling of the alternate qubit, $\{|-1/2\rangle, |1/2\rangle\}$, (see FIG. 22), provided the splitting $\delta E_E = 2p_E|E|$ is of the order of that due to stress, e.g., in the GHz range. The transition electric dipole moment, $p_E$, can be extracted from experiments. For example, bulk dielectric absorption measurements can yield values of $p_E \approx 0.26D$ where $D=3.336\times10^{-30}$ C m is the Debye unit for e.d.m. Thus, a splitting of 1 GHz can be obtained using an electric filed $|E|_{1GHz} \approx 3.85\times10^5$ V/m, which is readily achievable in nanodevices. Note, however, that increasing the field (splitting) exponentially decreases the qubit lifetime due to acceptor ionization. Thus, for $\delta E=1$ GHz the lifetime is $\tau_{ion} \approx 12$ s, while for $\delta E \approx 1.26$ GHz, the lifetime reduces to $\tau_{ion} \approx 12$ ms.

These numbers show that there is an experimental "window" for the alternate qubit, $\{|-1/2\rangle, |1/2\rangle\}$, discussed above. For example, for a qubit (Zeeman) splitting of $\delta E_H = 1$ GHz and a strain splitting $$\delta E_\varepsilon = 1.43 \text{ GHz } \left(\text{ratio of } r_h \equiv \frac{\delta E_H}{\delta E_\varepsilon} = 0.7\right),$$

the coupling factor reaches a maximal value of $f(r_h, r_\varepsilon) \approx 0.4$ for $\delta E_E = 1$ GHz, i.e., $r_h = 0.7$. Analogously, for a qubit splitting of $\delta E_H = 2$ GHz, the electric field splitting leads to the same coupling factor of 0.4, thereby allowing for the possibility of a strong acceptor-phonon coupling and a relatively long (static field) ionization lifetime.

For low-energy acoustic phonons the interaction Hamiltonian, $\hat{H}_{ph}$, has the form of Eq. (9) discussed above, with the strain operator $$\hat{\varepsilon}_{ij}(r) = \frac{1}{2}\left(\frac{\partial u_i}{\partial r_j} + \frac{\partial u_j}{\partial r_i}\right)$$

expressed via the quantized mechanical displacement: $u(r) = \Sigma_{q,\sigma}(u_{q\sigma}(r)b_{q\sigma} + u_{q\sigma}^*(r)b_{q\sigma}^\dagger)$. The mode normalization is given by $$\int d^3r \, u_{q\sigma}^*(r) u_{q\sigma}(r) = \frac{\hbar}{2\rho\omega_{q\sigma}}, \text{ so that } b_{q\sigma}^\dagger$$

creates a phonon in the mode (q, σ) with energy $\hbar \omega_{q\sigma}$ in a mode volume V where ρ represents the material mass density. The vector q denotes a collective index of the discrete phonon mode defined via the phonon cavity boundary conditions and mode volume V. The phonon-acceptor coupling $\hbar g_{q\sigma}^{s's} \equiv \langle s'; q\sigma | H_{ph} | s \rangle$ enters in a Jaynes-Cummings Hamiltonian such that $H_g \approx \hbar g_{q\sigma}^{s's}(\sigma_{s's}^+ b_{q,\sigma} + \sigma_{s's}^- b_{q,\sigma}^\dagger)$, where only the resonant cavity phonon has been retained and $\sigma_{s's}^+ \equiv |s'\rangle\langle s|$ refers to the relevant acceptor transition.

TABLE 3

Rates and parameters for circuit QED, quantum dot, and phoniton systems in a patterned silicon membrane device.

| Parameter | Symbol | Circuit-QED | Quantum Dot QED | B:Si (1 GHz) | B:Si (4 GHz) | B:Si (8 GHz) | B:Si (1 Tesla) |
|---|---|---|---|---|---|---|---|
| Resonance Freq. | $\omega_r/2\pi$ | 5.7 GHz | 325 THz | 1 GHz | 4 GHz | 8 GHz | 14 GHz |
| Vacuum Rabi Freq. | $g/\omega\pi$ | 105 MHz | 13.4 GHz | 0.41 MHz | 3.27 MHz | 9.26 MHz | 21.4 MHz |
| Cavity Lifetime | 1/κ, Q | 0.64 μs, $10^4$ | 5.5 ps, $1.2 \times 10^4$ | 15.9 μs, $10^5$ | 4 μs | 2 μs | 1.14 μs |
| Qubit Lifetime | 1/Γ | 84 ns | 27 ps | 386.5 μs | 6 μs | 0.75 μs | 0.14 μs |
| Critical Atom # | $2\Gamma\kappa/g^2$ | $<8.6 \times 10^{-5}$ | <1.87 | $<4.9 \times 10^{-5}$ | $<2 \times 10^{-4}$ | $<3.9 \times 10^{-4}$ | $<6.9 \times 10^{-4}$ |
| Critical Photon # | $\Gamma^2/2\,g^2$ | $<1.6 \times 10^{-4}$ | $<9.4 \times 10^{-2}$ | $<5.1 \times 10^{-7}$ | $<3.2 \times 10^{-5}$ | $<2.6 \times 10^{-4}$ | $<1.4 \times 10^{-3}$ |
| # of Rabi flops | $2\,g/(\kappa + \Gamma)$ | ~98 | ~0.8 | ~79 | ~99 | ~64 | ~34 |
| Cavity Volume | V | $10^{-6}\,\lambda^3$ | — | $0.037\,\lambda^3$ | $0.148\,\lambda^3$ | $0.296\,\lambda^3$ | $0.52\,\lambda^3$ |
| Wavelength | λ | 5.26 cm | 921 nm | 5400 nm | 1350 nm | 675 nm | 385 nm |
| Dispersive Coupling | $\chi = g^2/\Delta$ | 17 MHz | — | 0.04 MHz | 0.33 MHz | 0.93 MHz | 2.14 MHz |
| Peak resolution | 2χ/Γ | ~6 | — | ~199 | ~25 | ~9 | ~4 |
| # of peaks | 2χ/κ | ~70 | — | ~8 | ~16 | ~23 | ~31 |

A phonon-photon translator (PPT) can be based on optomechanical non-linearities that couple in the same bandgap cavity two photon modes ($\hat{a}$, $\hat{a}_p$) and a phonon mode $\hat{b}$ via optomechanical coupling $h_{om}$. For photons in the near-infrared range (i.e., $\lambda_{opt} \approx 1500$ nm), the PPT can allow a quantum optical input/output channel (e.g., of frequency $\omega/2\pi \approx 200$ THz) to be coupled to a phonon channel (e.g., with frequency $\omega_d/2\pi \approx 4$-8 GHz). The coupling between the fields can be enhanced by the auxiliary photon pump channel, pumping at the sideband resolved frequency $\omega_p=\omega-\omega_d-\Delta$. At pump detuning $\Delta=0$, it is as resonance with the red side-band of mode $\omega$. The coherent nature of the PPT can be described by the effective beam-splitter type Hamiltonian:

$$H_{b-s}=-\Delta \hat{b}^\dagger \hat{b}+G_{om}(\hat{a}^\dagger \hat{b}+\hat{a}\hat{b}^\dagger). \quad (13)$$

where $G_{om} \propto h_{om}E_0$ is the enhanced effective coupling, proportional to the pump field amplitude, $E_0$. In the weak coupling regime, total optical reflection can be avoided when $G_{om}<\kappa^{opt}$, and optimal translation (e.g., close to 100%) can take place at a matching condition of $G_{om}=\sqrt{\kappa^{opt}\kappa^{mech}}$, where $\kappa^{opt}$ and $\kappa^{mech}$ are the couplings of the PPT to respective photon/phonon waveguides.

Since the PPT can be realized on the same device, e.g., on the same silicon nanomembrane, a simultaneous photonic/phononic bandgap structure is implied. As a result, it may be considered that photons (e.g., 200 THz photons) may affect the qubit lifetime when they reach the acceptor. However, the corresponding photon energy (e.g., 0.82 eV) is less than the indirect bandgap in silicon (e.g., $\Delta E_{gap}=1.1$ eV). Thus, interband transitions are not generally possible. Considering an "ionization process" of a bound hole going to the continuous spectrum (e.g., an analog of the ionization of an (anti)hydrogen atom), the corresponding cross section is re-scaled using the following re-scaled values: free hole mass $m_A \simeq 0.23 m_e$ in silicon, an effective Bohr radius $$a_A^{eff} = \frac{e^2 Z}{2[4\pi\varepsilon_0\varepsilon_r]E_A},$$

with the acceptor ionization energy for B:Si of $E_A \approx 0.044$ eV, and a screening factor of $Z \simeq 1.4$. The total cross section can be given by:

$$\sigma_{phot} = \frac{32\pi}{3} \frac{\hbar^6}{c\sqrt{2m_A} m_A^3 [a_A^{eff}]^5 E_f^{2.5}(E_f+E_A)} \frac{1}{[4\pi\varepsilon_o\varepsilon_r]}, \quad (14)$$

where $E_f=\hbar\omega-E_A$ is the final (free) hole energy and $c=c_0/\sqrt{\varepsilon_r}$ is the speed of light in silicon ($\varepsilon_r^{Si} \simeq 11.9$). Since $E_A \ll E_f$, the total cross section is suppressed as $\propto 1/E_f^{3.5}$ (final state energy suppression). Given $n_c$ photons in a cavity volume $V \simeq d\lambda^2$, the acceptor lifetime is given by $\tau_{phot}=2V/(n_c c \sigma_{phot})$ for a maximum photon-acceptor overlap. This limits the ability to perform active photon (sideband) cooling of the phononic cavity. However, by placing the acceptor close to a node of the photon cavity, the ionization lifetime can increase considerably.

Figure 16:
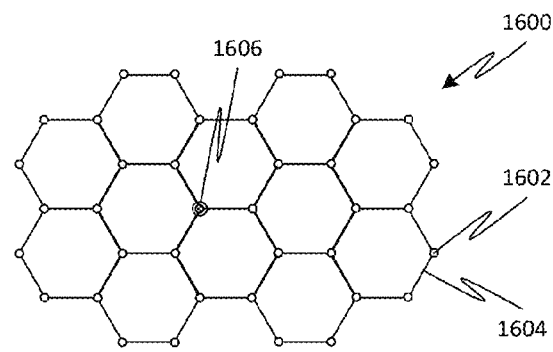
FIG. 16 is a schematic diagram of a carbon-based quantum phoniton device, according to one or more embodiments of the disclosed subject matter.

In embodiments, the quantum TLS can be formed in a crystalline host formed of carbon. In particular, the host can take the form of crystalline carbon with the quantum TLS replacing one of the carbon atoms in the host. As used herein, the term crystalline carbon is intended to refer to those allotropes of carbon that have an organized crystal structure over a substantial portion of the material, for example, diamond, lonsdaleite, a carbon nanotube, a graphene sheet, or fullerene. Referring to FIG. 16, a simplified structure 1600 of crystalline carbon is shown for illustrative purposes. Such structure 1600 may represent a portion of a wall of a carbon nanotube, a portion of a wall of a fullerene, a portion of a graphene sheet, or a slice of other allotropes of crystalline carbon. In the structure, carbon atoms 1602 are bonded to each other via bonds 1604. A TLS 1606 may be formed by replacing one or more of the carbon atoms 1602 in the lattice 1600 with an impurity (e.g., a donor or an acceptor), a defect, and/or a color center. Phoniton use and generation in crystalline carbon can be similar to that described above with respect to semiconductor and other materials.

Phonons may find use in some applications due to their slower speed than other types of signals, such as photons. For example, many signal processing applications can use phonons to slow down optical signals on a chip. The phoniton and devices incorporating the phoniton(s) as disclosed herein provides another tool to manipulate these sound waves and has potential application in inter-conversion of information, both classical and quantum. In addition, phonons can be created more easily than photons (for example, by using temperature alone). Moreover, because of the large strain energies per phonon in typical semiconductors and extremely small mode volume as compared to light wavelengths, the devices incorporating phonitons can exhibit very large phonon-matter coupling (g) as compared to traditional cavity QED systems, even for relatively large phonon volumes. This leads to highly quantum behavior as well as quantum behavior at higher temperatures, e.g., even at room temperature, for example when using a levitating nanosphere (in such a configuration the laser/optical tweezer trapping system can be at room temperature even though the mechanical degree of freedom is cooled down effectively to very low temperatures via laser cooling approaches), which may be relevant for quantum information technology such as simulation, entangling operations, etc. Large cavity phonon coupling can allow for low-energy or threshold-less switches/logic.

In addition, phoniton devices as disclosed herein can find application in telecommunications and computer systems. For example, cell phone technology currently employs surface acoustic wave modulators for delaying optical signals. Phonitons provide another tool by which to manipulate, delay, or amplify telecommunication signals. Moreover, the quantum phoniton devices provide a tool for manipulating, storing, and/or slowing phonons. Thus, the phoniton devices described herein can be used as memory devices or in filtering applications.

Coherent phonons can be used for imaging (e.g., at smaller wavelength as compared to lasers). The TLS transitions (and corresponding emitted phonons) of the phoniton devices described herein can operate in the THz frequency and lower, and can be tuned over a relatively wide frequency range. Phonons in the THz range have nanometer-scale resolution. Because of this, devices incorporating phonitons may be suitable for imaging small objects, for example, for medical or security applications. A phoniton device can be constructed to provide a coherent source of phonons in a tunable regime of interest.

The phoniton is a new component for constructing and controlling macroscopic artificial quantum systems based on sound. Besides single phonon devices, systems composed of many coupled phonitons could exhibit novel quantum many-body behavior. For example, "solid-sound" systems can demonstrate Mott insulator like states of phonons in coupled phoniton cavities. Cavity/qubit geometries such as these may also be relevant for quantum computing (QC) applications, for example, to mediate interactions between distant qubits or inhibit decoherence. The systems proposed here will benefit from the drive in silicon QC towards more purified materials, perfect surfaces, and precise donor placement. Moreover, as described above, phoniton devices can be constructed for low-threshold phonon lasing, phonon Bose-Einstein condensation sensors, and solid sound by incorporating multiple phonitons on a single device.

Further applications for the disclosed phoniton devices can include, but are not limited to, on-chip sensors, such as accelerometers, gradiometers, and sound detectors (for example, by employing phoniton condensates); information processing, such as phonon logic; and quantum information processing, such as qubit conversion, delay, and entanglement.

Although specific configurations and materials have been described herein, the teachings of the present application are not limited thereto. Rather, other configurations and materials are also possible according to one or more contemplated embodiments of the disclosed subject matter.

The foregoing descriptions apply, in some cases, to examples generated in a laboratory, but these examples can be extended to production techniques. For example, where quantities and techniques apply to the laboratory examples, they should not be understood as limiting.

Features of the disclosed embodiments may be combined, rearranged, omitted, etc., within the scope of the invention to produce additional embodiments. Furthermore, certain features may sometimes be used to advantage without a corresponding use of other features.

It is, thus, apparent that there is provided, in accordance with the present disclosure, phoniton systems, methods, and devices. Many alternatives, modifications, and variations are enabled by the present disclosure. While specific embodiments have been shown and described in detail to illustrate the application of the principles of the invention, it will be understood that the invention may be embodied otherwise without departing from such principles. Accordingly, Applicants intend to embrace all such alternatives, modifications, equivalents, and variations that are within the spirit and scope of the present invention.

The invention claimed is:

1. A quantum device comprising:
a quantum two-level system within a cavity, which is a phonon cavity or a mechanical cavity, said two-level system having a first energy state and a second energy state; and
a phonon trapped by the cavity and coupled to the two-level system such that energy of the trapped phonon in the cavity is resonant or near-resonant with a transition of the two-level system between the first and second energy states.

2. The quantum device of claim 1, wherein the quantum two-level system is a single impurity embedded in a semiconductor material.

3. The quantum device of claim 1, wherein the quantum two-level system is a single donor or acceptor atom, a single defect, or a single color center in carbon in the form of diamond, a nanotube, graphene, or fullerene.

4. The quantum device of claim 1, wherein the quantum two-level system is a quantum dot.

5. The quantum device of claim 1, wherein the phonon is coupled to the quantum two-level system such that the coupling rate between the phonon and the two-level system is greater than losses of the two-level system and the phonon in the cavity.

6. The quantum device of claim 1, wherein the phonon has a frequency in the terahertz regime or lower.

7. A quantum device comprising:
a quantum two-level system within a cavity, which is a phonon cavity or a mechanical cavity, said two-level system having a first energy state and a second energy state; and
a phonon coupled to the two-level system such that energy of the phonon in the cavity is resonant or near-resonant with a transition of the two-level system between the first and second energy states,
wherein the cavity is configured to trap the phonon therein, with the quantum two-level system disposed at an antinode or a node of the phonon.

8. A phoniton device comprising:
a crystalline host having a phonon confinement structure; and
at least one two-level system within the phonon confinement structure of the crystalline host, the at least one two-level system having at least first and second energy states,
wherein the phonon confinement structure is configured to direct a phonon to the at least one two-level system such that the energy of the phonon within the confinement structure corresponds to a transition at or near a difference between the first and second energy states of the at least one two-level system,
wherein the at least one two-level system is at least one of a single donor atom, a single acceptor atom, a single defect, a single color center, and a quantum dot.

9. The phoniton device of claim 8, wherein the phonon confinement structure is configured to trap the phonon therein such that an antinode or a node of the phonon is at a position of the at least one two-level system.

10. The phoniton device of claim 8, wherein the at least one two-level system is a plurality of two-level systems within the same phonon confinement structure.

11. The phoniton device of claim 10, wherein the plurality of two-level systems constitutes a linear or two-dimensional array that is ordered or random.

12. The phoniton device of claim 8, wherein the phonon confinement structure comprises a plurality of cavities, with at least one two-level system in each cavity, and the phonon confinement structure is constructed such that a phonon from one of the plurality of cavities can coherently tunnel to an adjacent one of the plurality of cavities.

13. The phoniton device of claim 12, wherein the phonon confinement structure is configured such that phonons can tunnel between adjacent cavities.

14. The phoniton device of claim 8, wherein the phonon confinement structure comprises a cavity with a reflector that at least partially reflects phonons from the cavity back into the cavity.

15. The phoniton device of claim 8, wherein the phonon confinement structure is configured to allow partial escape of phonons in a coherent and directional manner.

16. The phoniton device of claim 8, wherein the phoniton device is configured as a sensor, a phonon detector, or a phonon source.

17. The phoniton device of claim 8, wherein the crystalline host comprises a semiconductor region, the semiconductor region being formed of a Group III-V or Group II-VI semiconductor and being arranged between respective superlattices as portions of the phonon confinement structure, the superlattices including semiconductor layers of other Group III-V or Group II-VI semiconductors, the at least one two-level system being a donor atom or an acceptor atom.

18. The phoniton device of claim 8, wherein the crystalline host comprises a semiconductor region, the semiconductor region being formed of silicon or a Group IV semiconductor as a main component and being arranged between respective superlattices as portions of the phonon confinement structure, the superlattices including semiconductor layers of silicon-germanium or other Group IV semiconductors, the at least one two-level system being a donor atom or an acceptor atom.

19. The phoniton device of claim 18, wherein the at least one two-level system is a phosphorus atom or a lithium atom.

20. The phoniton device of claim 8, wherein the crystalline host is diamond and the at least one two-level system comprises a color center and a defect.

21. The phoniton device of claim 8, wherein the crystalline host is one of a carbon nanotube, a graphene sheet, or a fullerene, and the at least one two-level system comprises at least one of a donor, an acceptor, or a defect.

22. The phoniton device of claim 8, wherein the crystalline host is one of a levitating semiconductor nanocrystal or a three-dimensional spherical quantum dot, and the at least one two-level system comprises a donor atom or an acceptor atom contained therein.

23. The phoniton device of claim 8, wherein the crystalline host is a planar membrane, the at least one two-level system is an acceptor atom or a donor atom within the planar membrane, and the planar membrane has an array of holes therein as portions of the phonon confinement structure, the array of holes being periodic or aperiodic.

24. The phoniton device of claim 8, wherein the difference between the first and second energy states of the at least one two-level system is tuned by at least one of an external magnetic field, an external electric field, and mechanical strain, or the at least one two-level system, which is coupled to the phonon in the phonon confinement structure, is probed by an electric microwave to excite transitions of said at least one two level system.

25. The phoniton device of claim 8, wherein the at least one two-level system and the phonon confinement structure are constructed such that:

the at least one two-level system interacts with and absorbs the directed phonon to transition from the first energy state to the second energy state, the at least one two-level system emits a phonon to transition from the second energy state to the first energy state, the emitted phonon having a same wavelength and mode as the directed phonon, and the phonon confinement structure redirects the emitted phonon back to the at least one two-level system for repeated interaction therewith.

* * * * *